(12) United States Patent
Sundaram et al.

(10) Patent No.: US 10,672,718 B2
(45) Date of Patent: Jun. 2, 2020

(54) THROUGH-PACKAGE-VIA (TPV) STRUCTURES ON INORGANIC INTERPOSER AND METHODS FOR FABRICATING SAME

(71) Applicant: GEORGIA TECH RESEARCH CORPORATION, Atlanta, GA (US)

(72) Inventors: Venkatesh Sundaram, Alpharetta, GA (US); Fuhan Liu, Atlanta, GA (US); Rao R. Tummala, Greensboro, GA (US); Vijay Sukumaran, Atlanta, GA (US); Vivek Sridharan, Atlanta, GA (US); Qiao Chen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 15/005,275

(22) Filed: Jan. 25, 2016

(65) Prior Publication Data
US 2016/0141257 A1     May 19, 2016

Related U.S. Application Data

(62) Division of application No. 13/582,453, filed as application No. PCT/US2011/027071 on Mar. 3, 2011, now Pat. No. 9,275,934.
(Continued)

(51) Int. Cl.
*H01L 21/48*     (2006.01)
*H01L 23/00*     (2006.01)
(Continued)

(52) U.S. Cl.
CPC .......... *H01L 23/562* (2013.01); *H01L 21/486* (2013.01); *H01L 21/76843* (2013.01);
(Continued)

(58) Field of Classification Search
CPC ................. H01L 23/562; H01L 23/481; H01L 21/76843; H01L 21/486; H01L 23/15
See application file for complete search history.

(56) References Cited

U.S. PATENT DOCUMENTS

| 6,663,946 | B2 * | 12/2003 | Seri ................... | H01L 23/49894 |
| | | | | 174/250 |
| 7,547,564 | B2 * | 6/2009 | Lee ....................... | H01L 51/003 |
| | | | | 257/E21.502 |

(Continued)

FOREIGN PATENT DOCUMENTS

| CN | 101199049 A | 6/2008 |
| JP | A-1994275737 | 9/1994 |

(Continued)

OTHER PUBLICATIONS

Chinese Office Action dated Mar. 16, 2016, which issued during prosecution of Chinese Application No. 2011800221526.
(Continued)

*Primary Examiner* — Benjamin P Sandvik
(74) *Attorney, Agent, or Firm* — Troutman Sanders LLP; Ryan A. Schneider

(57) ABSTRACT

Disclosed herein are, for instance, methods for producing through package vias in a glass interposer. For instance, disclosed herein is a method for producing through package vias in a glass interposer comprising laminating a polymer on at least a portion of a top surface of a glass interposer, removing at least a portion of the polymer and the glass interposer to form a through via, filling at least a portion of the through via with a metal conductor to form a metallization layer, and selectively removing a portion of the metallization layer to form a metalized through package via. Other methods are also disclosed, along with through-package-via structures in glass interposers produced therefrom.

18 Claims, 24 Drawing Sheets

Related U.S. Application Data

(60) Provisional application No. 61/309,952, filed on Mar. 3, 2010.

(51) Int. Cl.
*H01L 23/15* (2006.01)
*H01L 23/498* (2006.01)
*H01L 21/768* (2006.01)
*H01L 23/48* (2006.01)
*H01L 23/31* (2006.01)

(52) U.S. Cl.
CPC ............ *H01L 23/15* (2013.01); *H01L 23/481* (2013.01); *H01L 23/49827* (2013.01); *H01L 23/3128* (2013.01); *H01L 23/49816* (2013.01); *H01L 23/49822* (2013.01); *H01L 2224/16225* (2013.01); *H01L 2924/01019* (2013.01); *H01L 2924/15311* (2013.01)

(56) References Cited

U.S. PATENT DOCUMENTS

| | | | |
|---|---|---|---|
| 8,168,470 B2* | 5/2012 | Lin | H01L 21/486 438/107 |
| 8,207,453 B2* | 6/2012 | Ma | H01L 21/4803 174/262 |
| 2002/0088116 A1 | 7/2002 | Milkovich et al. | |
| 2003/0038344 A1* | 2/2003 | Palmer | H01L 21/76898 257/621 |
| 2003/0151144 A1* | 8/2003 | Muta | H01L 21/76898 257/774 |
| 2005/0121768 A1 | 6/2005 | Edelstein et al. | |
| 2007/0108591 A1 | 5/2007 | Sunohara | |
| 2007/0240901 A1* | 10/2007 | Okamoto | H05K 3/445 174/262 |
| 2008/0164573 A1 | 7/2008 | Basker et al. | |
| 2008/0210664 A1* | 9/2008 | Uenishi | B01D 65/02 216/67 |
| 2008/0251932 A1 | 10/2008 | Arana et al. | |
| 2008/0272465 A1 | 11/2008 | Do et al. | |
| 2008/0283282 A1* | 11/2008 | Kawasaki | H01L 23/49811 174/258 |
| 2009/0294161 A1* | 12/2009 | Yoshimura | H05K 3/4608 174/258 |
| 2009/0308651 A1* | 12/2009 | Abe | H05K 3/445 174/264 |
| 2011/0147055 A1* | 6/2011 | Ma | H01L 21/4803 174/255 |
| 2011/0217657 A1 | 9/2011 | Flemming et al. | |
| 2011/0227227 A1 | 9/2011 | West | |
| 2012/0261805 A1 | 10/2012 | Sundaram et al. | |
| 2014/0035935 A1 | 2/2014 | Shenoy et al. | |

FOREIGN PATENT DOCUMENTS

| | | |
|---|---|---|
| JP | A-1996-124967 | 5/1996 |
| JP | 2002359446 A | 12/2002 |
| JP | A-2005-310934 | 4/2004 |
| JP | A-2004-179545 | 6/2004 |
| JP | A-2005136042 | 5/2005 |
| JP | 2010010592 A | 1/2010 |
| WO | 02/100142 | 12/2002 |

OTHER PUBLICATIONS

Chinese Office Action dated Sep. 17, 2015, which issued during prosecution of Chinese Application No. 2011800221526.
Chinese Office Action dated Dec. 31, 2014, which issued during prosecution of Chinese Application No. 2011800221526.
Chinese Search Report dated Mar. 3, 2011, which issued during the prosecution of Chinese Application No. 2011800221526.
Abstract of CN101199049 from Espacenet, accessed Jan. 16, 2015.
Abstract of JP2002-359446 from Patent Abstracts of Japan, accessed Jan. 16, 2015.
Abstract of JP2010-010592 from Patent Abstracts of Japan, accessed Jan. 16, 2015.
International Search Report and Written Opinion dated May 19, 2011 for related PCT Patent Application No. PCT/US2011/027071.
International Preliminary Report on Patentability dated Sep. 4, 2012 for related PCT Patent Application No. PCT/US2011/027071.
Office Action from related Korean Application No. 10-2012-7025823 dated Feb. 14, 2017 (19 pages, including 9 pages of English translation).
Office Action from related Japanese Application No. 2016-043983 dated May 30, 2017 (5 pages, including 2 pages of English translation).
Supplementary European Search Report and Opinion from related European Patent Application No. 11751376, dated Dec. 18, 2017.

* cited by examiner

*Exit side of via*

*Slanted via side wall*

THROUGH-PACKAGE-VIA (TPV) STRUCTURES ON INORGANIC INTERPOSER AND METHODS FOR FABRICATING SAME

CROSS-REFERENCE TO RELATED APPLICATIONS

This application is a divisional application of (and that claims the benefit of priority of) U.S. patent application Ser. No. 13/582,453, filed 13 Nov. 2012, which claims the benefit of International Patent Application No. PCT/US2011/027071, filed 3 Mar. 2011, which claims the benefit of U.S. Provisional Patent Application No. 61/309,952 filed 3 Mar. 2010, each of which is incorporated by reference herein in its entirety.

FIELD

The present system relates generally to interposers.

BACKGROUND

Substrates used in semiconductor package circuits provide a microelectronic package with a mechanical base support and an electrical interface for external communication access to the devices housed within the package. An interposer is an intermediate layer often used for interconnection routing between packages or integrated circuits ("IC"s) as a ground/power plane. Sometimes the terms "substrate" and "interposer" are used to refer to the same thing. A three dimensional interposer, or "3D Interposer," is an interconnection between multiple ICs and the circuit board, or substrate, on which the ICs are installed. When used in applications involving ICs, interposers can provide an ultra-wide bandwidth between 3D ICs by means of fine pitch through-silicon-vias ("TSV"s) and through-package-vias ("TPV"s). TSVs are vertical electrical connections passing completely through a silicon wafer or die whereas TPVs, or generally through vias, are vertical electrical connections passing between or passing completely through one or more packages.

TPVs are an important component in the creation of 3D packages and 3D ICs. TPVs provide the means for designers to replace the edge wiring when creating 3D packages (e.g., System in Package, Chip Stack Multi-chip Module). By using TPVs, designers of 3D packages or 3D ICs can reduce the size of the IC or package, e.g., miniaturization. This is provided for because of the reduced, or eliminated, need for edge wiring as well as the ability to double-side mount both types of active circuits, logic and memory. The use of TPVs can also help reduce the size of passives on the board. These benefits also provide a means to extend wafer level packaging to higher I/Os as an alternative to wafer level fan out technologies.

Some requirements for Interposers are (1) good dimensional stability at ultra fine pitch; (2) good coefficient of thermal expansion ("CTE") match with substrate and die, (3) good thermal path from the IC to the board; and (4) enable integration of embedded passive components with high quality factors.

SUMMARY OF THE DISCLOSURE

Briefly described, the present invention utilizes a through-package-via stress relief barrier, or buffer layer, that provides thermal expansion and contraction stress relief barrier along with and improved metallization capabilities. The stress relief barrier helps to reduce the effects of stress caused by the different CTEs while also, in some applications, promoting adhesion between the metallization layer and the interposer. This helps to increase reliability while also providing for smaller designs.

In an exemplary embodiment of the present invention, a stress buffer layer is deposited on a glass interposer material. The stress buffer layer is designed to also act as an adhesion promoter for the metallization layer to be added at a later time. The stress buffer layer material can vary but preferable has a relatively high structural stability, exhibit low-loss properties, and has a relatively low dielectric constant, e.g., low-k. In some instances, the stress buffer layer having one or more of these characteristics not only helps to reduce the effects of thermal stress, but the stress buffer layer also enables high quality factor RF integration, a feature increasingly necessary in higher I/O applications. In some embodiments, the stress buffer layer is a polymer that is applied using a vacuum heating apparatus. In a further example, the polymer is a copper clad polymer.

In this embodiment, once the stress buffer layer is deposited, through vias are formed. Vias can be formed using various methods including, but not limited to, mechanical removal, laser ablation, or chemical removal. After the vias are formed, a metallization seed layer is applied to help promote adhesion between the via side wall and the stress buffer layer with the metallization, which is, in some embodiments, copper. After the metallization is applied, selective removal of portions of the metallization occurs to produce the TPVs.

In another exemplary embodiment, the present invention comprises forming one or more vias in a glass interposer. Thereafter, the vias are filled with a polymer stress buffer layer. Holes are then formed through the stress buffer layer. A seed layer is formed and, thereafter, metallization is applied. Selective removal of the metallization forms TPVs. In this embodiment, the stress buffer layer acts as the support structure for the TPVs.

In a further exemplary embodiment, the invention comprises forming through vias in a glass interposer material. A combined seed and buffer layer is formed on the surface and the walls of the vias. In some embodiments, the stress/buffer layer is a metal, such as palladium. The vias are then filled with metallization that is subsequently selectively removed to form TPVs.

In a still further exemplary embodiment, the present invention comprises laminating an interposer with polymer lamination. Vias are then formed and a buffer layer is applied to the polymer lamination and the via side walls. A combined seed layer/via fill metallization layer is applied and then subsequently selectively removed to form TPVs.

The foregoing summarizes beneficial aspects of the present invention, but is not intended to be reflective of the full scope of the present invention as claimed. Additional features and advantages of the present invention are set forth in the following description, are apparent from the description, or learned by practicing the present invention. Moreover, the foregoing summary and following detailed description are exemplary and explanatory, and are intended to provide further explanation of the present invention as claimed.

BRIEF DESCRIPTION OF THE DRAWINGS

The accompanying drawings, which are incorporated in and constitute a part of this specification, illustrate multiple exemplary embodiments of the present invention and, together with the description, serve to explain the principles of the present invention. They are not intended in any manner to limit the scope of the present invention. Headings provided herein are for convenience only and do not necessarily affect the scope or meaning of the claimed invention.

DETAILED DESCRIPTION

Figure 1:
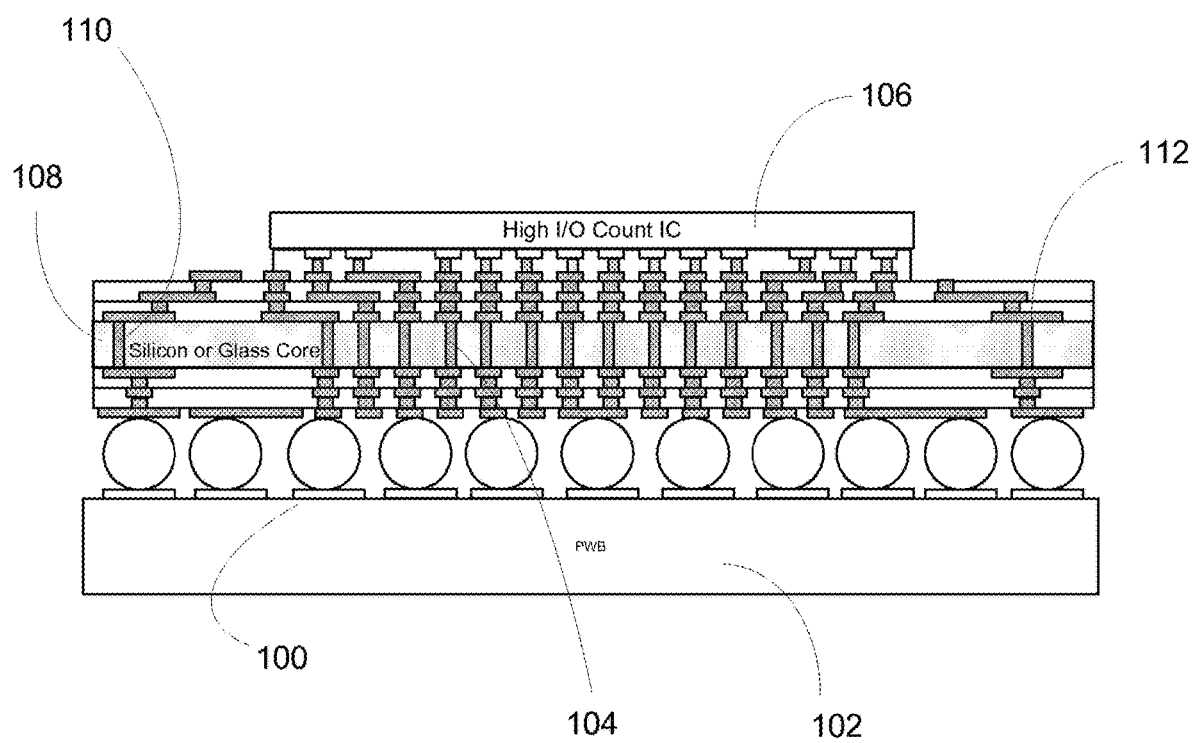
FIG. 1 illustrates through package via using glass as the interposer according to an exemplary embodiment of the present invention.

The subject matter of the various embodiments is described with specificity to meet statutory requirements. However, the description itself is not intended to limit the scope of the claimed invention. Rather, it has been contemplated that the claimed invention can be embodied in other ways, to include different steps or elements similar to the ones described in this document, in conjunction with other present or future technologies. Although the term "step" can be used herein to connote different aspects of methods employed, the term should not be interpreted as implying any particular order among or between various steps herein disclosed unless and except when the order of individual steps is explicitly required. The following description is illustrative and non-limiting to any one aspect.

It should also be noted that, as used in the specification and the claims, the singular forms "a," "an" and "the" include plural references unless the context clearly dictates otherwise. For example, reference to a component is intended to also include composition of a plurality of components. References to a composition containing "a" constituent are intended to include other constituents in addition to the one named. Also, in describing preferred embodiments, terminology will be resorted to for the sake of clarity. It is intended that each term contemplates its broadest meaning as understood by those skilled in the art and includes all technical equivalents that operate in a similar manner to accomplish a similar purpose.

Ranges can be expressed herein as from "about" or "approximately" one particular value and/or to "about" or "approximately" another particular value. When such a range is expressed, other exemplary embodiments include from the one particular value and/or to the other particular value. The terms "comprising" or "containing" or "including" mean that at least the named component, element, particle, or method step is present in the system or article or method, but does not exclude the presence of other components, materials, particles, or method steps, even if the other such components, material, particles, and method steps have the same function as what is named.

It is also to be understood that the mention of one or more method steps does not preclude the presence of additional method steps or intervening method steps between those steps expressly identified. Similarly, it is also to be understood that the mention of one or more components in a system or composition does not preclude the presence of additional components than those expressly identified. To facilitate an understanding of the principles and features of the present invention, embodiments are explained hereinafter with reference to implementation in illustrative embodiments.

Interposer technology has evolved from ceramic to organic materials and, most recently, to silicon. Organic substrates typically require large capture pads because they exhibit relatively poor dimensional stability. However, there are two major shortcomings seen with the present-day approach using organic substrates. It is often difficult to achieve high I/Os at fine pitch because of poor dimensional stability of organic cores. Also, warpage results as the number of layers are increased. In a lot of cases, these issues cause organic substrates, or interposers, to be particularly unsuitable for very high I/Os with fine pitch interconnections. Because of this, there has been a trend to develop and use silicon interposers instead of organic interposers. But, silicon interposers also present issues. Silicon interposers are relatively expensive to process due to the need for electrical insulation around via walls. Also, silicon interposers are limited in size by the silicon wafer from which they originate.

As an alternative to silicon, the present invention utilizes glass as the interposer to address the limitations of both silicon and organic interposers. The inherent electrical properties of glass, together with large area panel size availability, offer advantages over silicon and organic interposer materials in some applications. The use of glass, though, presents some challenges, namely, the formation of vias at low cost and glass' lower thermal conductivity when compared to silicon.

Glass is increasingly being used to solve the issues presented by conventional interposers. Glass as a substrate, e.g., interposer, has several merits. Glass has a relatively good dimensional and thermal stability, the CTE of glass is closely matched to silicon, exhibits relatively good electrical properties, and is relatively available in large panel sizes. For example, machines that process large panel liquid crystal display (LCD) glass substrates used for high definition displays can be readily incorporated for processing glass interposers, achieving low cost and higher throughput.

Table 1 compares the key electrical properties, process complexity and relative cost of glass, silicon and other potential metal and ceramic interposers.

| Material | Glass | CMOS grade Si | Large area PV Si | Metals Cu/Al | SiC |
|---|---|---|---|---|---|
| Electrical Resistivity (ohm · cm) | $10^{12}$ to $10^{16}$ | $6.4 \times 10^4$ | $15 \times 10^{-3}$ to $40 \times 10^{-3}$ | $1.7 \times 10^{-6}$ | $10^2$ to $10^6$ |
| Electrical Insertion Loss | Very Low | High | High | Moderate | Moderate |
| Ease of via Formation | Slow | Good | Good | Moderate | Moderate |
| Ease of Metallization | Poor (direct deposition) | Dielectric liner require | Dielectric liner require | NA | Good |
| Raw Wafer or Panel Cost | Low | High | Moderate | Low | High |
| Processed Cost per I/O | Low | High | Moderate | Moderate | High |

While glass can exhibit superior electrical qualities to silicon, the reduction of the size of the IC or package requires smaller and more tightly spaced TPVs for electrical connectivity. The reduced size of the IC or package presents issues relating to the thermal expansion and contraction of the different materials forming the TPV, interposer and metal layer. As the different materials expand and contract, their different coefficients of thermal expansion cause them to expand and contract at different rates. In a small size IC or package, the stress induced by the different CTEs in conventional TPVs reduced the reliability of the interposer and TPVs. Although not limited to this reason, a significant majority of conventional TPVs fail because the conventional TPVs separate from the interposer thru thermal expansion and contraction. In addition, the different thermal expansion and contract rates can also introduce micro-cracks that are developed and propagated by the continuous expansion and contraction.

The present invention aims to ameliorate the reliability of glass interposers having TPVs by help to reduce the physical effects, or stress, that the different CTEs pose. In one embodiment of the present invention, a stress relief barrier, or stress relief layer, is used to act as a buffer to absorb the stress caused by the difference of CTEs between the metal conductor (i.e. metallization, typically copper), and the glass interposer. The stress relief barrier is an elastic interface that helps to maintain the physical connection between the metal conductor and the glass interposer, as well as any additional layers such as a metallization seed layer. The elastic property helps to reduce the probability of the occurrence of opens or shorts caused by the metal layer becoming physically detached from the interposer. Additionally, the stress relief barrier can help reduce or eliminate the propagation of cracks in the glass interposer formed either as a manufacturing defect, as a defect introduced during a processing step, or during thermal cycling. In some embodiments, using a stress relief barrier can help to reduce the thickness of the glass interposer, e.g., provide for "thin glass" interposers. Further, applying a stress relief barrier prior to via creation can help increase the pitch of the via, e.g., fine pitch or smaller pitch, by preventing removal of the top layer of the glass surrounding the via.

FIG. 1 illustrates a package design having through vias in a glass interposer according to an exemplary embodiment of the present invention. Ball grid array 100 is in electrical communication with printed circuit board 102. Through package vias, represented generally by through package via 104, communicatively connect printed circuit board 102 to high I/O Count Integrated Circuit 106. Through package vias 104 are supported by glass interposer 108. Stress relief barrier 112 is deposited between copper metallization 110 and glass interposer 108 to help reduce or eliminate physical defects that can cause electrical errors such as shorts or opens caused by the different CTEs between copper 110 deposited in through vias 104 and glass interposer 108. As previously discussed, stress relief barrier 112 is an elastic interface that helps to absorb some of the stress caused by the different CTEs to maintain copper 110 in physical contact with interposer 108.

Because stress relief barrier 112 is designed to have some elastic and insulating properties, in some embodiments, a polymer having those properties can be used. Some embodiments of polymers that can be suitable include, but are not limited to, ZIF, RXP4, Dupont™ Kapton® polymide film, Dupont™ Pyralux® AC, and Dupont™ Pyralux® AP. It should be appreciated by those of ordinary skill in the art that the present invention is not limited to these polymers, but can also include other suitable polymers having similar physical and electrical qualities. In exemplary embodiments of the present invention, the polymer is deposited as a dry film, liquid coating or vapor phase deposition thin film. In an exemplary embodiment of the present invention, stress relief barrier as a coefficient of thermal expansion between glass and the metallization. Additionally, it should be understood by those of ordinary skill in the art that the present invention is not limited to polymers, as other non-polymeric materials having similar physical and electrical properties can be used. In some embodiments of the present invention, the metallization layer and the stress relief barrier are the same materials. In one exemplary embodiment, the metallization layer and the stress relief barrier may various metals or composite materials such as, but not limited to, copper, palladium, nickel, nickel alloys, and copper alloys.

Figure 2:
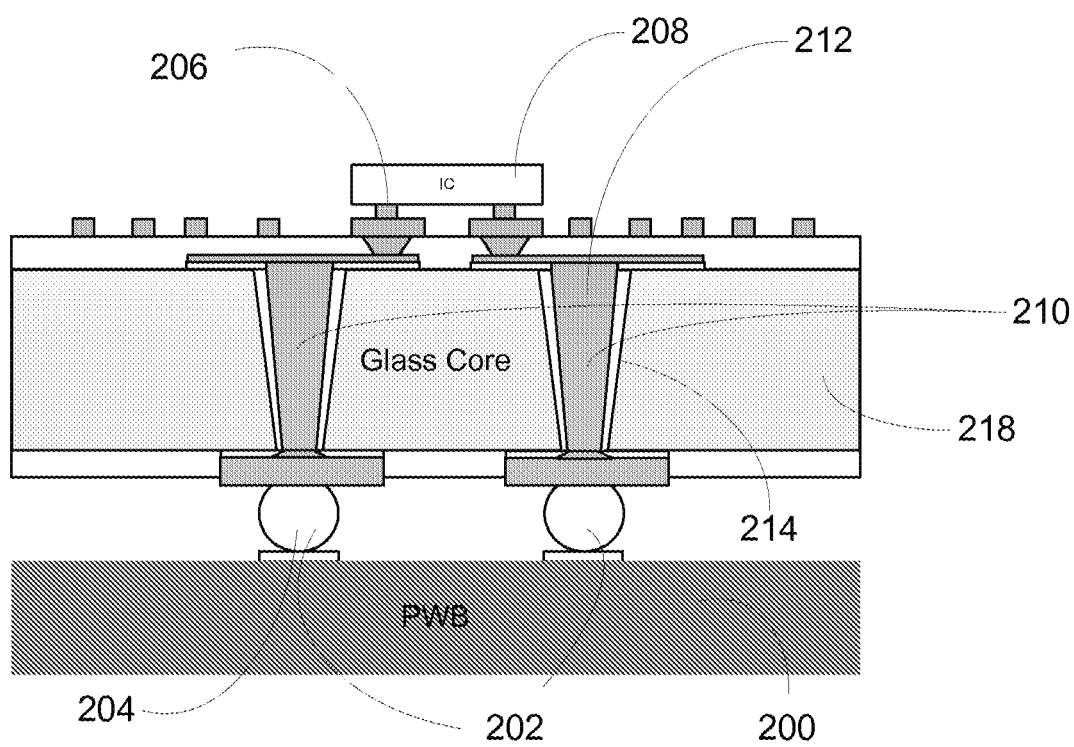
FIG. 2 illustrates the stress relief barrier using glass as the interposer according to an exemplary embodiment of the present invention.

FIG. 2 is an illustration of an expanded view of a stress relief barrier. On printed circuit board 200 is ball grid array 202. Ball grid array 202 provides an electric communication path between communication line 204 of printed circuit board 200 and communication line 206 of integrated circuit 208. Ball grid array 202 is in electrical communication with integrated circuit 208 through vias 210. Metal layer 212, typically copper, provides the electrical communication pathway from ball grid array 202 to integrated circuit 208.

As previously discussed, metal layer 212 will typically expand and contract during the use of integrated circuit 208. The expansion is caused by the heat generated when an electrical current passes through a conductor. In large scale applications, such as the wiring in a home, this heat typically dissipates into the air. In small scale applications, such as microscale packaging designs, the heat cannot dissipate fast enough to prevent warming of the components in the package. This warming effect causes the components in the package, including metal layer 212 and interposer 218, to expand. Upon the abatement of the current flow through metal layer 212, the materials will cool and contract. Interposer 218, glass in this example, will expand and contract at a different rate than metal layer 212, which typically expands faster than the interposer 218. The physical effects of this expansion and contraction, if not accounted for, can cause metal layer 212 to become partially or wholly removed from either glass interposer 218, ball grid array 202, or integrated circuit 208, or all of them.

To reduce the effects of the stress cause by the thermal cycling, stress relief barrier 214 is deposited between one or more portions of the metal layer 212 and glass interposer 218. As metal layer 212 and glass interposer 218 expand and contract, stress relief barrier 214, in some embodiments an elastic or semi-elastic polymer, absorbs the stress developed between metal layer 212 and interposer 218, maintaining the physical connection between metal layer 212 and vias 21. Stress relief barrier 214 helps to prevent the lifting or failure of vias 210, thereby maintaining electrical connectivity from printed circuit board 200 to integrated circuit 208. Additionally, depending on the type of polymer selected, stress relief barrier 214 can also promote adhesion of metal layer 212 to interposer 218 by acting as a type of "glue" that maintains the bond between interposer 218 and metal layer 212.

Testing of Electrical Properties

As previously discussed, glass interposers provide some advantages over silicon. The electrical behavior of TSVs (through vias in silicon) and TPVs (through vias in glass) were studied via simulations. From the simulated insertion loss plots for the TSVs and TPVs, it was observed that TPVs in glass interposer have negligible electrical signal loss as compared to TSVs in silicon interposer. Silicon's electrical conductivity is measurably higher than glass that leads to much higher substrate loss in TSVs as compared with TPVs. The electrical modeling results of the fabricated TPVs on glass are presented below.

Experimental Results

Four types of TPVs were studied and compared and are summarized in Table 2, below.

| TPV Formulation Process | Diameter (μm) | Pitch (μm) | Glass Thickness (μm) | Dielectric liner on Glass (μm) |
|---|---|---|---|---|
| CO₂ Laser | 125 (Top), 50 (Bottom) | 175 | 175 | No |
| UV Laser | 100 (Top), 50 (Bottom) | 250 | 175 | No |
| Excimer Laser | 35 (Top), 22 (Bottom) | 50 | 175 | Yes |
| Mechanical Drilling | 100 | 350 | 200 | No |

Figure 3:
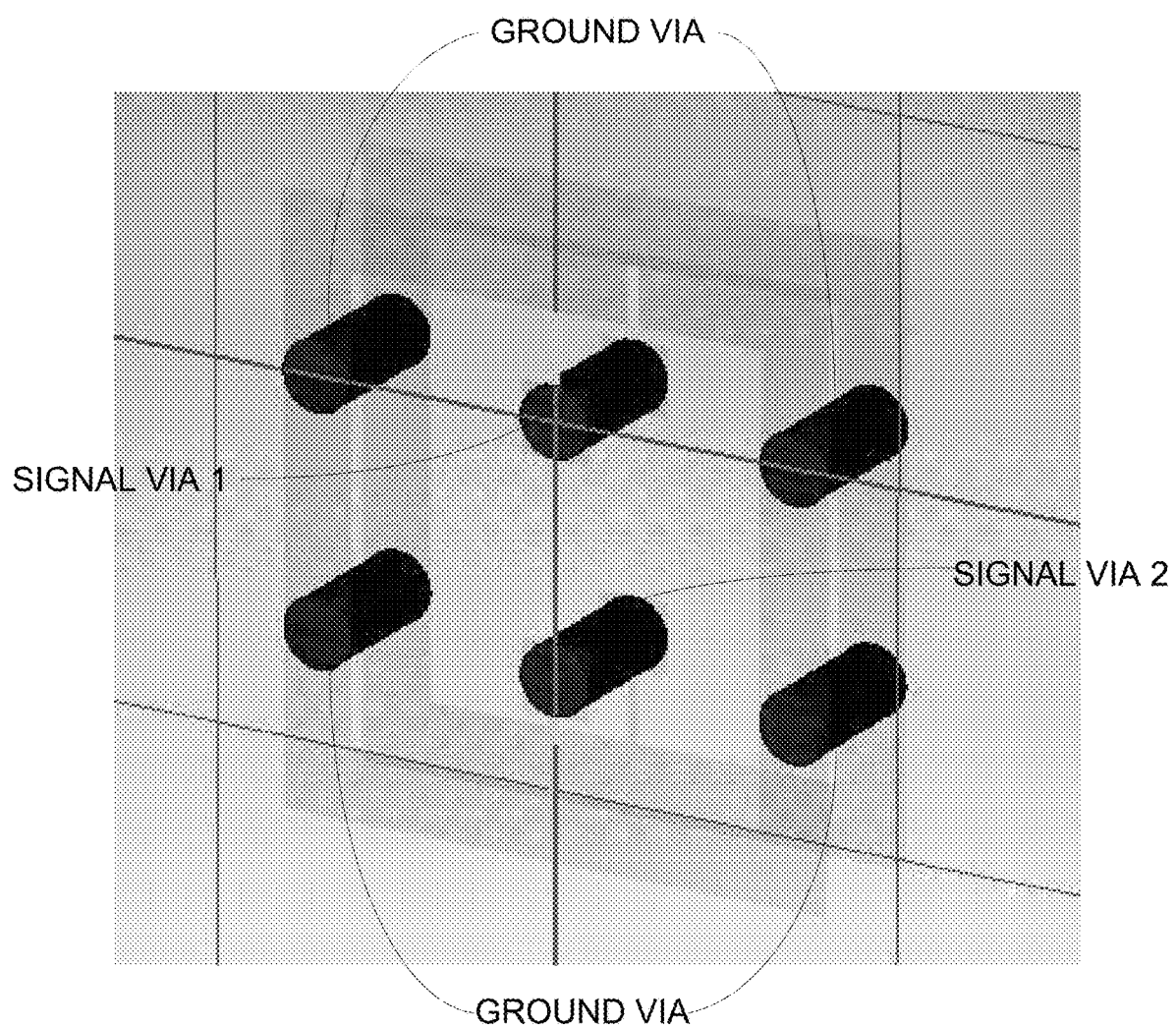
FIG. 3 illustrates a simulated model of a through package via to determine electrical modeling according to an exemplary embodiment of the present invention.
Figure 4:
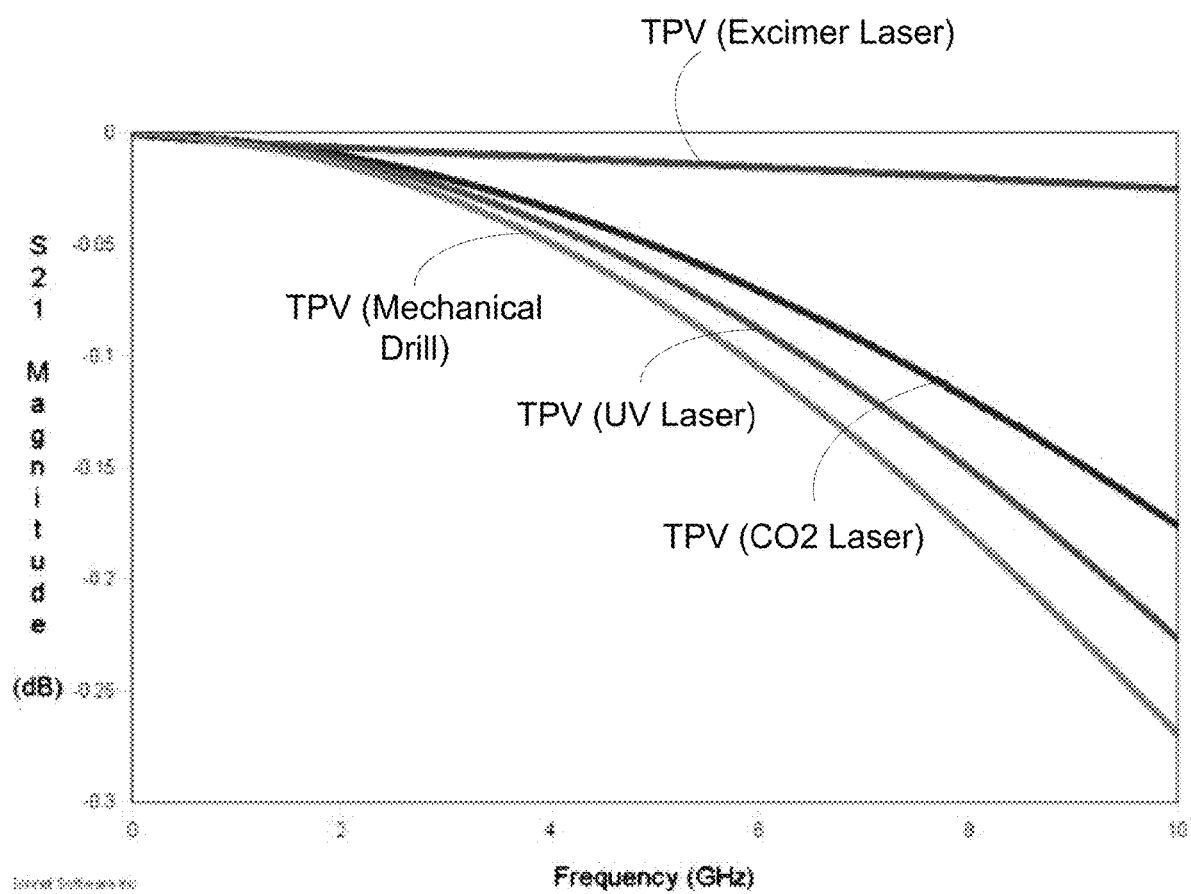
FIGS. 4, 5 and 6 illustrate test results of electrical modeling simulations according to an exemplary embodiment of the present invention.
Figure 5:
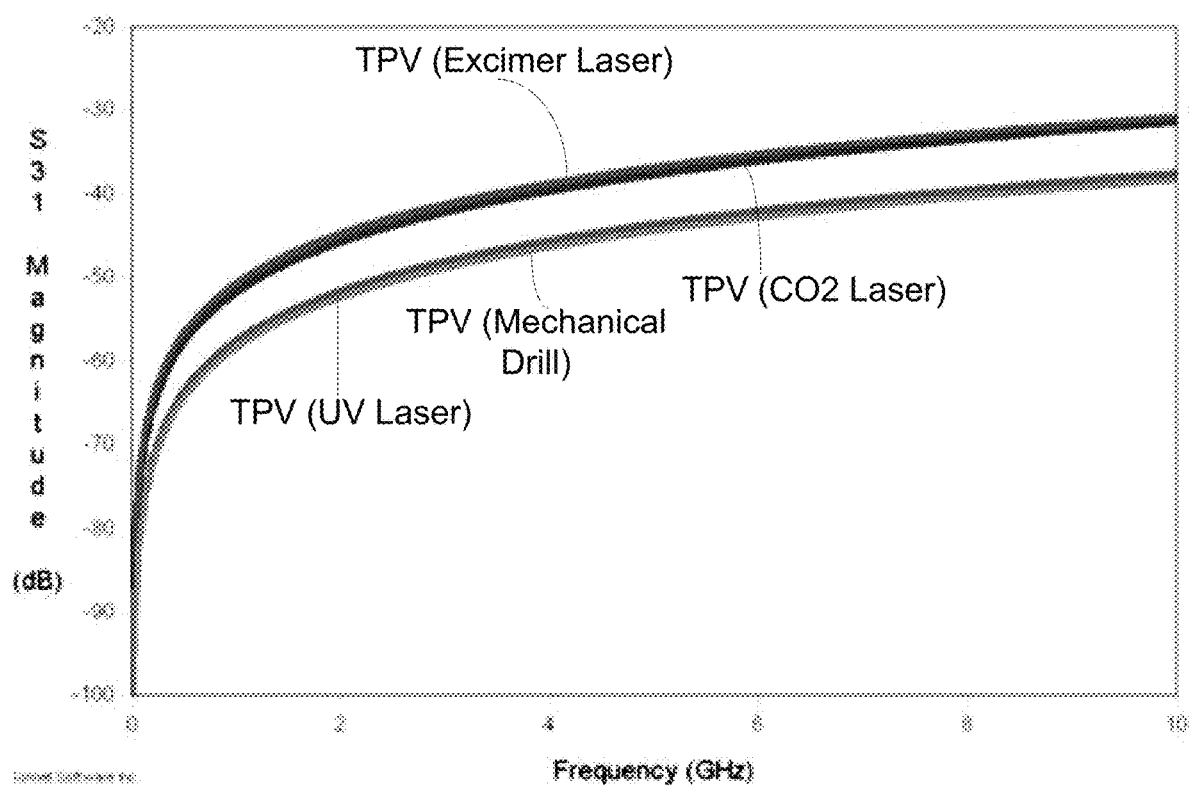
Figure 6:
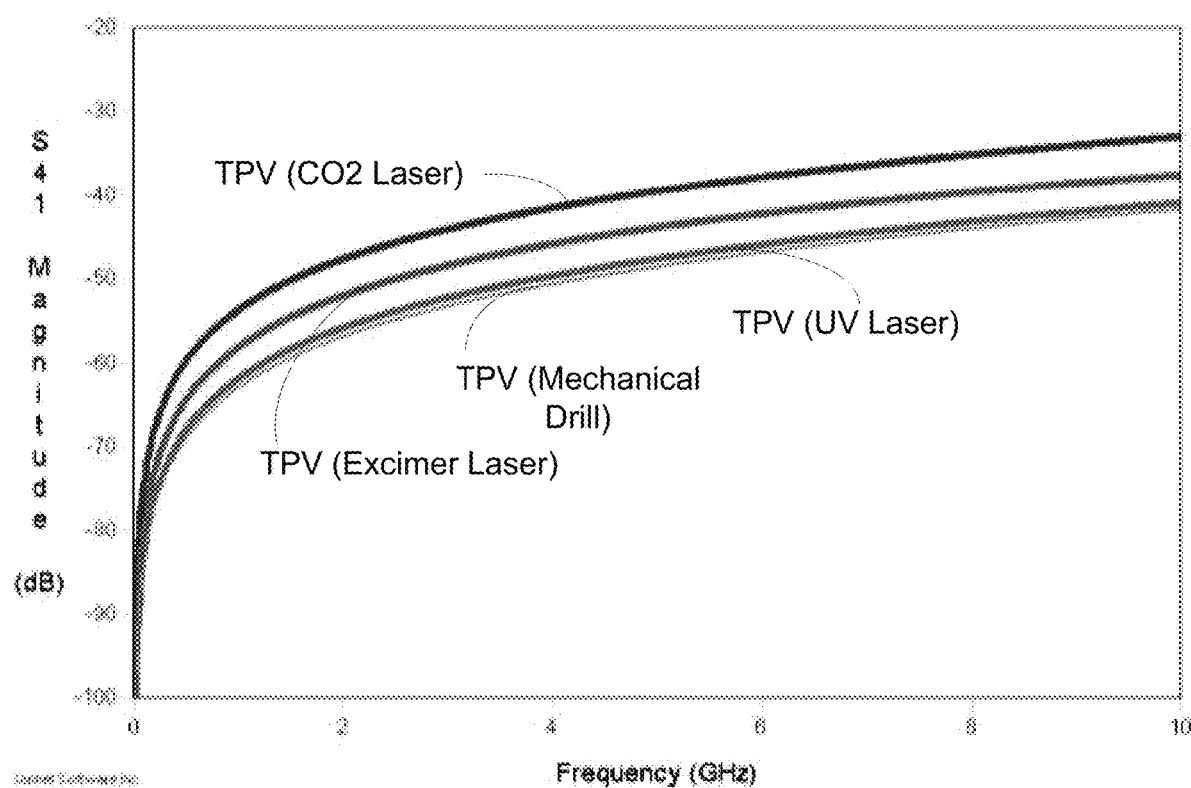

Borosilicate glass (BSG) was modeled as the substrate. The TPVs formed by an excimer laser were modeled with a 25 μm thick dielectric liner on the top and bottom surfaces of the glass substrate. TPVs were modeled and simulated for their electrical characteristics by means of 3D full-wave Electromagnetic (EM) simulations. CST Microwave Studio™ (CST-MWS) was used as a 3D full-wave EM simulator to study the system response of the vias up to 10 GHz. FIG. 3 shows the via model simulated with 4 ports in CST-MWS. Signal vias 1 and 2 were surrounded by two ground vias (each) on either side. The 4 ground vias were electrically connected. The signal vias 1 and 2 were excited with discrete (lumped) ports on their top and bottom surfaces. FIGS. 4, 5 and 6 show the insertion loss, near end crosstalk and far end crosstalk comparison, respectively, between these TPVs.

From FIG. 4, it can be observed that the TPVs formed by excimer lasers have the lowest signal loss whereas TPVs formed by UV laser have the highest loss. This behavior is due to the smaller size and pitch of the excimer laser TPVs. The TPVs formed by UV laser have higher loss than the $CO_2$ laser drilled TPVs due to the larger pitch in the former. It is noted that, in addition to producing smaller size and pitch vias, in some embodiments, the excimer laser via methods can reduce production time and costs. In the $CO_2$ laser and the UV laser, the glass is removed through the heating effect of the laser on the glass. In order for those lasers to provide sufficient power to a specific area, the laser beam will need to be focused on the area to be removed. In a different manner, the energy from the excimer laser does not rely on heat to remove material. Rather, the excimer laser breaks down the glass material. This permits the excimer laser to be focused over a much wider area, allowing for the formation of multiple vias at once. Additionally, if a copper or polymer layer is deposited on top of the glass interposer, with the area to be removed exposed to the excimer laser, the vias can form very high pitch walls, approaching vertical. This allows a greater density of vias in one area as well as reducing the cost and time associated with the making of the through vias.

From FIGS. 5 and 6, it can be observed that the crosstalk depends at least in part on the spacing between the signal vias. Since the mechanically drilled TPV has the largest via to via spacing, it has the lowest crosstalk. Similarly, TPV formed by lasers have higher crosstalk because it has the smaller spacing. As shown in FIG. 6, the fine or high pitch TPVs produced according to various embodiments of the present invention will have lower signal loss. It is preferable that the spacing between signal TPVs should be kept as large as possible to reduce crosstalk. Crosstalk reduction can also be achieved by other design techniques. For example, the signal TPVs can be separated from each other by ground TPVs.

Manufacturing of Glass Interposers

The role of the polymer material is to act as a stress relief barrier between the metal layer on the surface of the glass interposer and the metal in the core of the vias as well. In addition, the stress relief barrier can also help reduce the physical impact of a laser on the glass surface during the ablation process. In conventional systems, when a laser or other material removing means, such as acid, is used to create a through via, the top portion of the substrate is acted upon by the removal means for a longer period of time than the lower portions. An unintended consequence of this longer reaction time is that there is a continual removal of some of the top layers of the substrate. This causes low pitch vias, i.e. vias having side walls angles less than normal to the plane of the substrate. Low pitch vias not only require an increased amount of metallization to fill the via, thus increasing costs, but the dimensions of low pitch vias reduce the number of through vias that can be placed in an area on the substrate.

It is often desirable to produce through vias that have small or fine pitches. As previously discussed, a small or fine pitch means that the walls of the vias are normal or nearly normal to the plane of the surface of the substrate, e.g., vertical or nearly vertical. A through via with coarse pitch may have walls that extend in a diagonal direction from the base of the through via, forming a "V" shape. The formation of fine pitch vertical feed through on glass is a challenge while building a 3D interposer. Etching glass is typically more difficult than etching silicon. Wet etching yields higher etch rates (~10µ/min) but the isotropy of etch profile is unfavorable for through vias on thick substrates.

Figure 7:
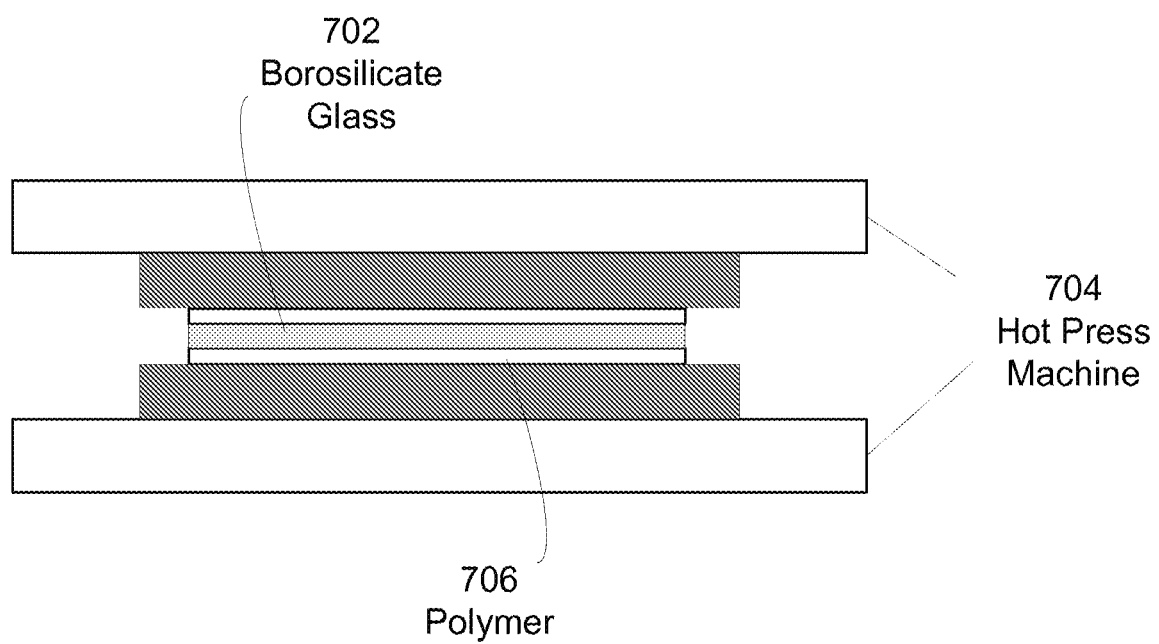
FIG. 7 illustrates lamination system for laminating a stress relief barrier on a glass interposer according to an exemplary embodiment of the present invention.

To achieve higher pitch through vias in glass, a stress relief barrier can be used as a shield or protective barrier to prevent the material removal means from undesirably removing top portions of the substrate around the through via. FIG. 7 is an illustration of an exemplary system for depositing a polymer layer on a glass substrate prior to removal of the substrate material to form a through via. Borosilicate glass ("BSG") is a type of glass that can be used as an interposer. It should be understood that the present invention is not limited to BSG as the interposer material. The surface of glass 702 can be first treated using acetone and Isopropyl alcohol. This treatment helps to provide a clean surface for lamination.

Figure 8:
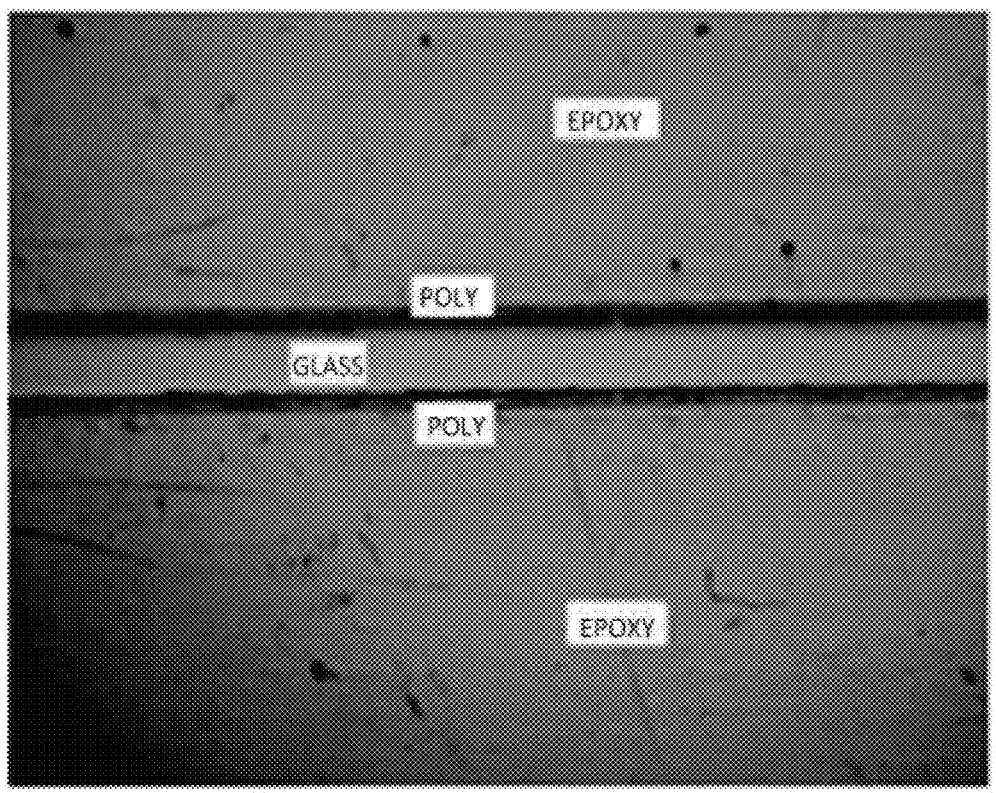
FIGS. 8 and 9 are optical images of a side view of a stress relief barrier laminated on a glass interposer according to an exemplary embodiment of the present invention.
Figure 9:
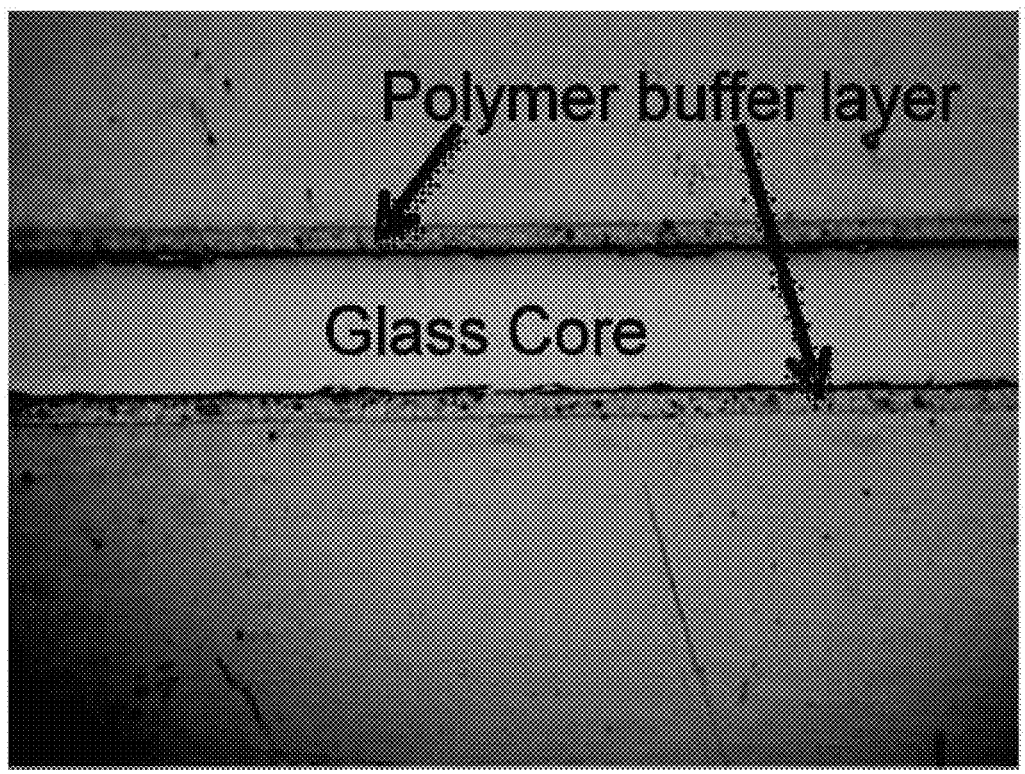

A hot press machine 704 can be to carry out the double sided lamination of polymer 706. It should be noted that the lamination process can be used on one surface, e.g., the top surface or bottom surface of glass 702, or, on both the bottom and top surfaces. The laminated glass 702 can then be subjected to laser ablation. During the laser ablation process, polymer 706 acts as a stress relief barrier as well as a protective shield. FIGS. 8 and 9 show the optical cross-section images of polymer on glass when using a process and materials similar to the process of FIG. 7.

Laser Ablation Testing

Figure 10A:
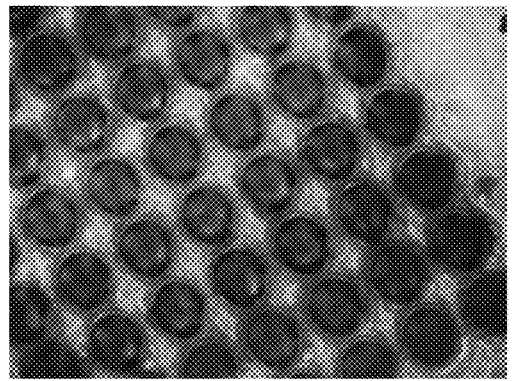
FIGS. 10a-d are images of through package via entrances and exits formed by $CO_2$ laser ablation according to an exemplary embodiment of the present invention.
Figure 10B:
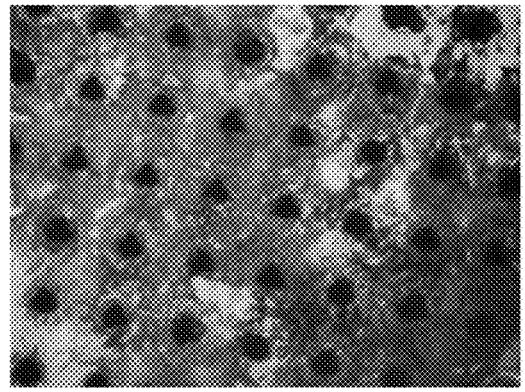
Figure 10C:
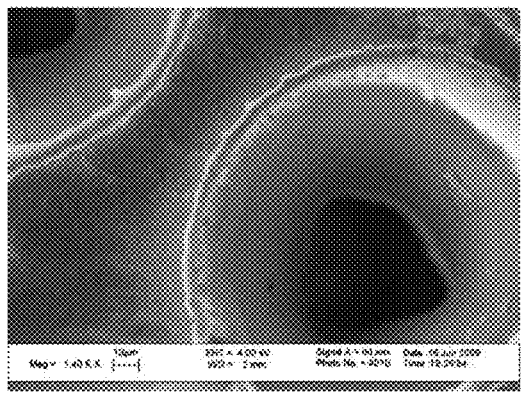
Figure 10D:
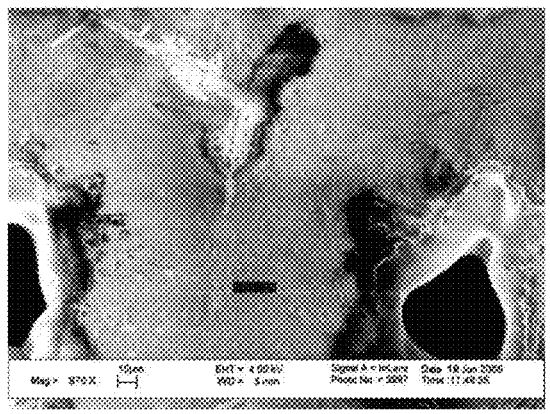
Figure 11A:
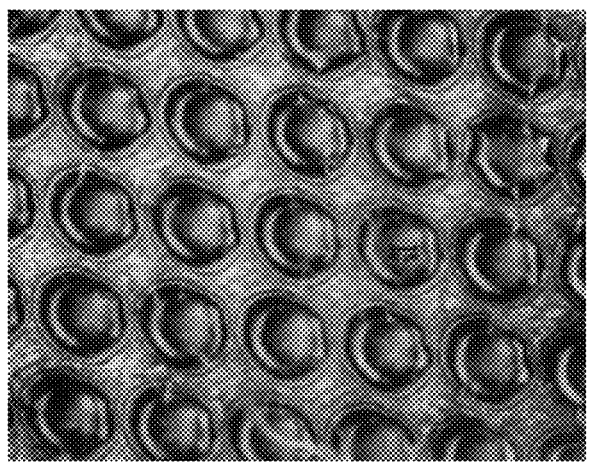
FIGS. 11a and 11b are images of through package via entrances and exits formed by $CO_2T$ laser ablation according to an exemplary embodiment of the present invention.
Figure 11B:
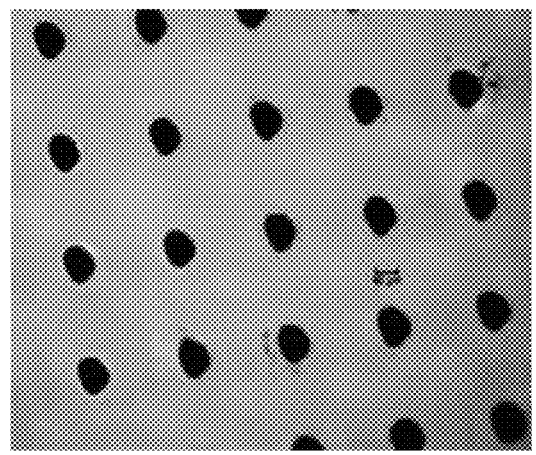

BSG samples of 175 µm and 500 µm thickness were subjected to $CO_2$ laser ablation. Initial results from $CO_2$ laser yielded large via diameter (125 µm diameter) and a highly tapered via profile with micro cracks along the via edges. Optical and SEM images of the vias by $CO_2$ laser ablation are shown in FIGS. 10(a),(b),(c),(d). The vias entrance diameters were generally 125 µm while the exit diameters were generally 50 µm with a TPV pitch of 175 µm. Micro-cracks were minimized by the use of $CO_2$ T laser at a slightly larger pitch that yielded fewer defects. FIGS. 11a and 11b are optical images of the entrance and exit of laser in the BSG glass sample ablated with a $CO_2$T laser.

Figure 12A:
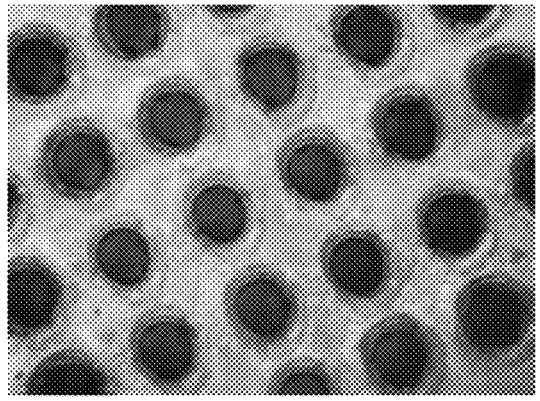
FIGS. 12a-d are images of through package via entrances and exits formed by UV laser ablation according to an exemplary embodiment of the present invention.
Figure 12B:
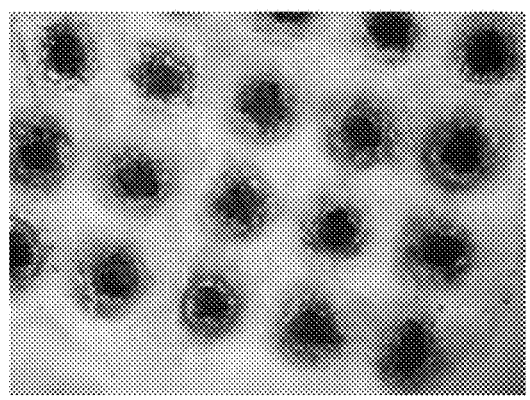
Figure 12C:
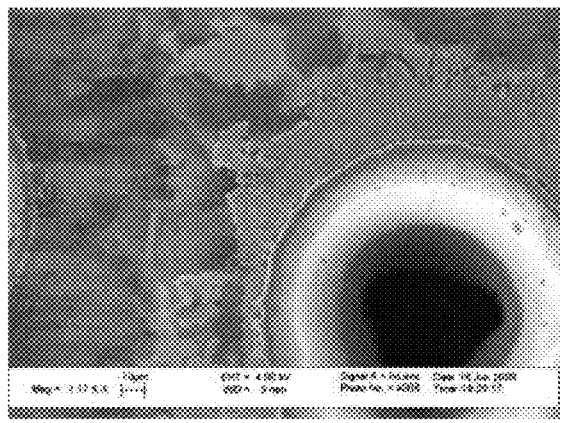
Figure 12D:
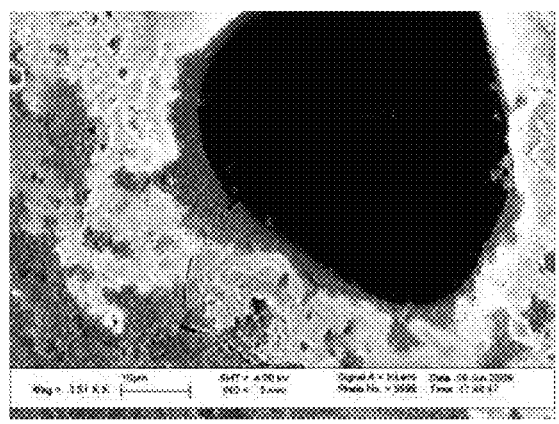

In another test, a UV laser was used for TPV formation. FIGS. 12a and 12b are optical images of via entrances (FIG. 12a) and exits (FIG. 12b) formed by a 266 nm UV laser ablation. FIGS. 12c and 12d are SEM images of a via entrance (FIG. 12c) and exit (FIG. 12d) formed by the 266 nm UV laser ablation. The results obtained were comparable to $CO_2$ lasers. The TPV pitch was 250 µm with entrance and exit diameters of 100 µm and 50 µm respectively. Finer pitch TPVs were achieved on 175 µm thin glass using an excimer laser. This resulted in smaller via size with entrance and exit diameters of 35 µm and 22 µm respectively at a pitch of 50 µm. No micro-cracks were observed on the glass surface after laser ablation. A cross-section study showed a smooth via sidewall profile.

Figure 13:
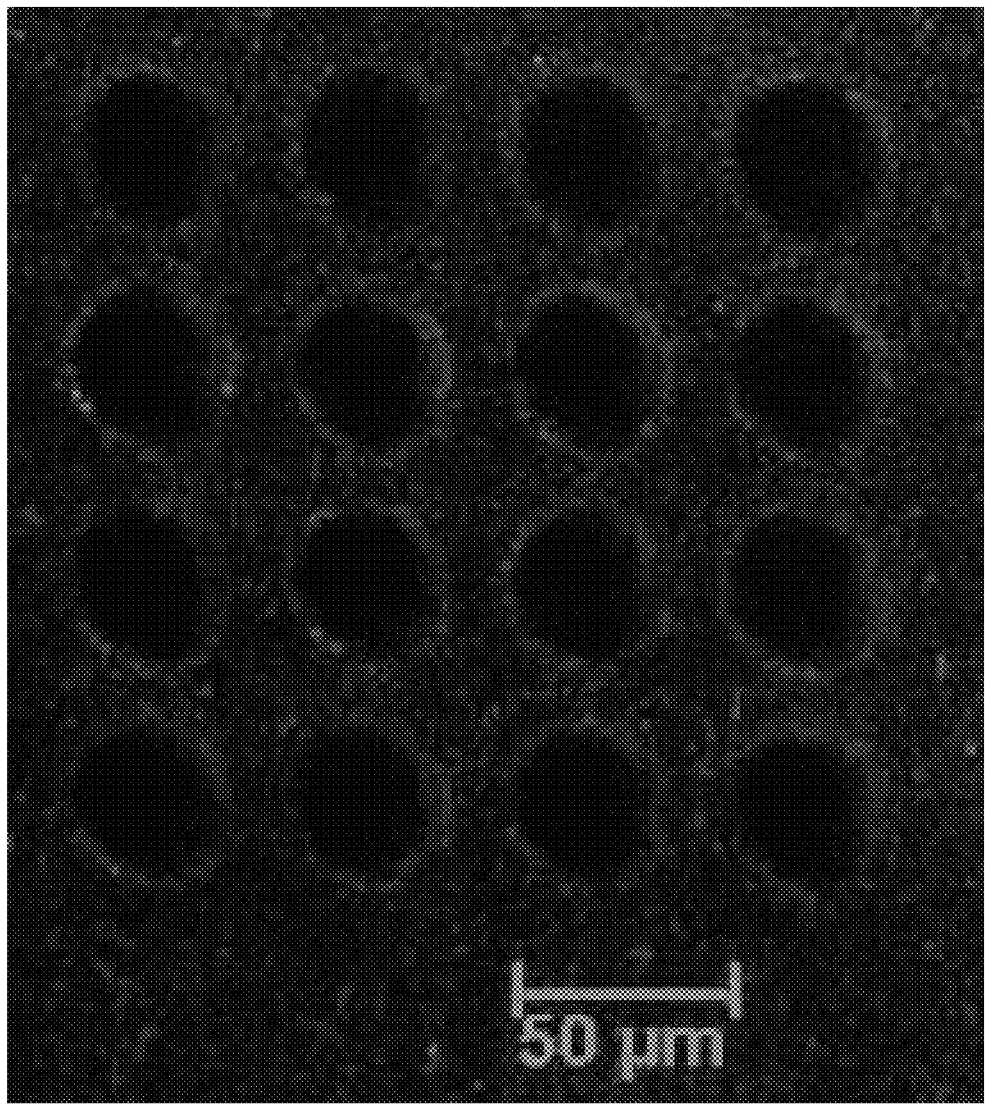
FIG. 13 is an image of through package via entrances formed by excimer laser ablation according to an exemplary embodiment of the present invention.

The excimer laser was also tested on polymer laminated glass samples. The via profiles look similar, however, the via diameter is slightly larger due to excess ablation of polymer around the via entrance caused by larger laser fluence. FIG. 13 is an optical image of fine pitch TPVs on polymer laminated glass. Controlling process parameters resulted in almost similar polymer and glass ablation.

Figure 14:
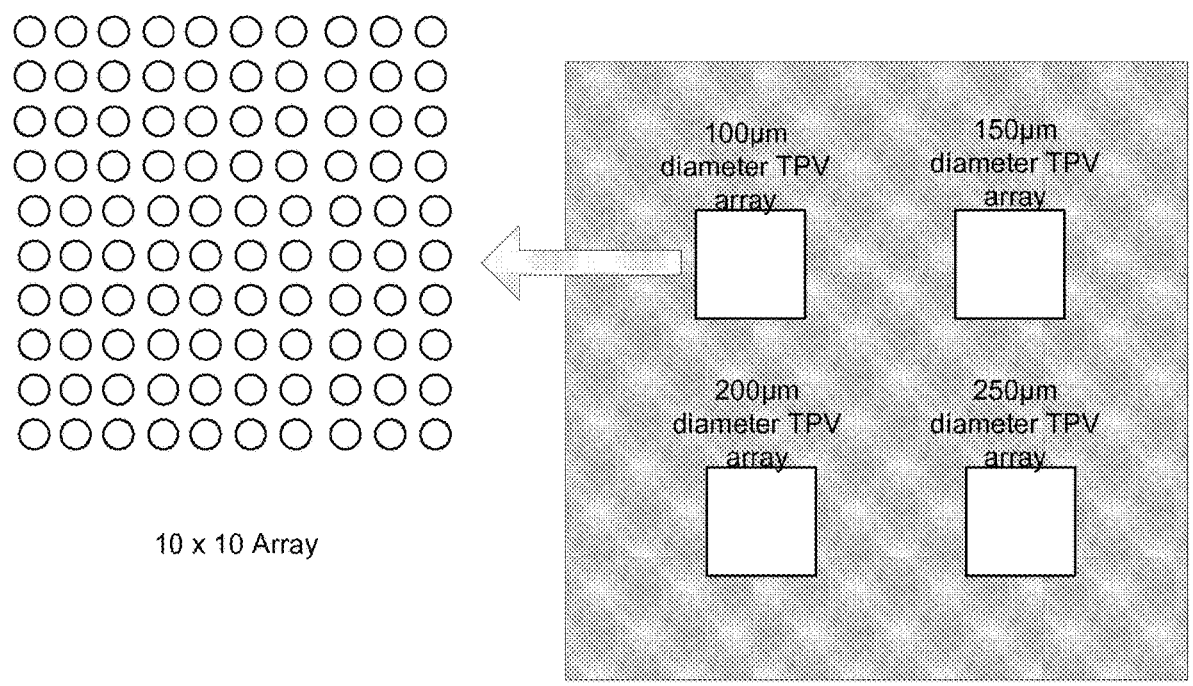
FIG. 14 is an illustration of a test layout for testing various glass interposer thicknesses according to an exemplary embodiment of the present invention.
Figure 15:
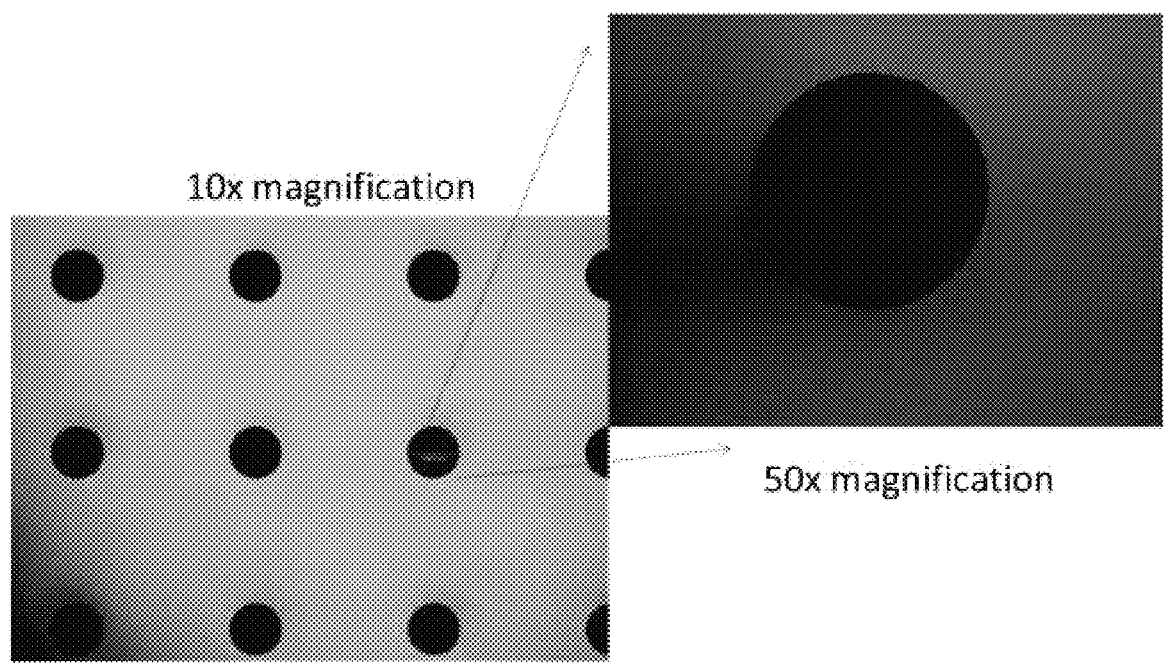
FIGS. 15 and 16 are images of mechanically produced through package vias according to an exemplary embodiment of the present invention.
Figure 16:
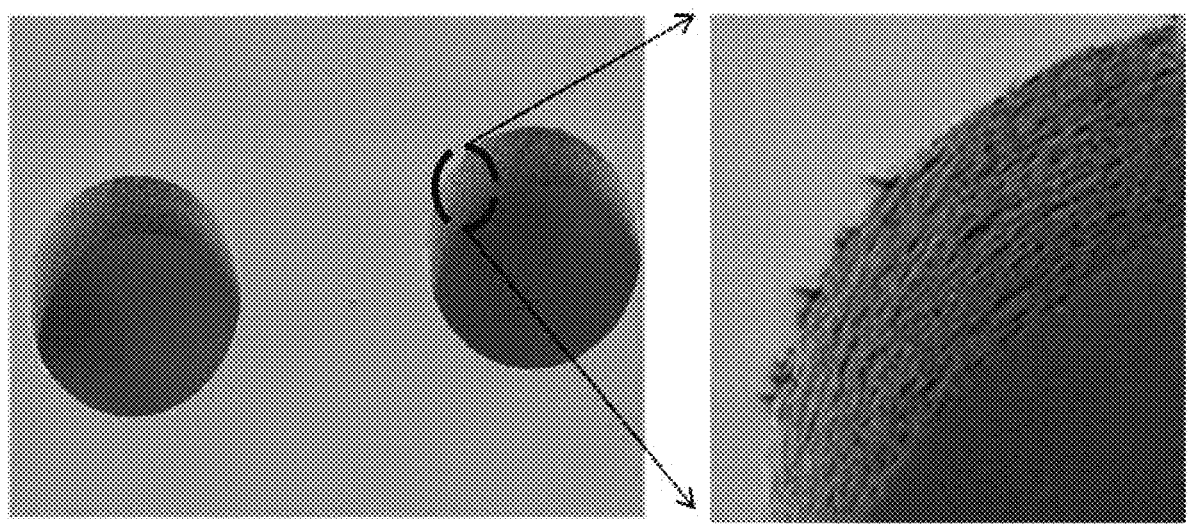

In another test, 200 µm and 500 µm BSG substrates were used as raw materials for via formation using a mechanical process. The glass samples were 2.7" squares and the design had variable via diameters from 100 µm to 250 µm with a step of 50 µm. The schematic of the test layout is shown in FIG. 14. The TPV pitch was kept constant at 350 µm. Glass TPV using mechanical techniques yielded large vias with larger pitch. These structures can be applied in the first architecture type where the glass interposer is used as a BGA for chip to PWB connection. Controlling process parameters resulted in almost similar polymer and glass ablation. The vias obtained by the mechanical process have a nearly vertical profile, almost 90 degree slant angle and crack free surface. FIG. 15 is a top optical view and FIG. 16 is an SEM image of the mechanically processed vias.

As discussed previously, the stress relief barrier can help to promote adhesion between the glass interposer and the metal conductor. It can be preferable or necessary to deposit the metal directly on the glass interposer, such as in the case of a wall of a through via. Direct Metallization on glass is a challenge due to CTE mismatch at the metal glass interface. Surface modification techniques can enhance direct metal adhesion on glass, but fabrication of a relatively thick metal liner on glass can result in delamination. The use of a polymer stress relief barrier can help to promote metal adhesion on the glass surface. Typically, TPV metallization is a two step process. A seed layer is first formed on all or part of the surfaces of the TPV which is followed by metallization using, among other metals and methods, copper electroplating. There may be various ways to form a seed layer. For example, and not by way of limitation, electroless copper deposition or sputtering can be used to form the seed layer.

Electroless copper is a relatively fast and low cost processing technique that is scalable to large panel sizes. The 175 µm thin glass substrate with polymer and TPVs was first cleaned and plasma treated to remove surface impurities. CF4 and O2 plasma was used for polymer surface modification. The sample was thoroughly rinsed post plasma treatment and subjected to seed layer metallization.

Figure 17:
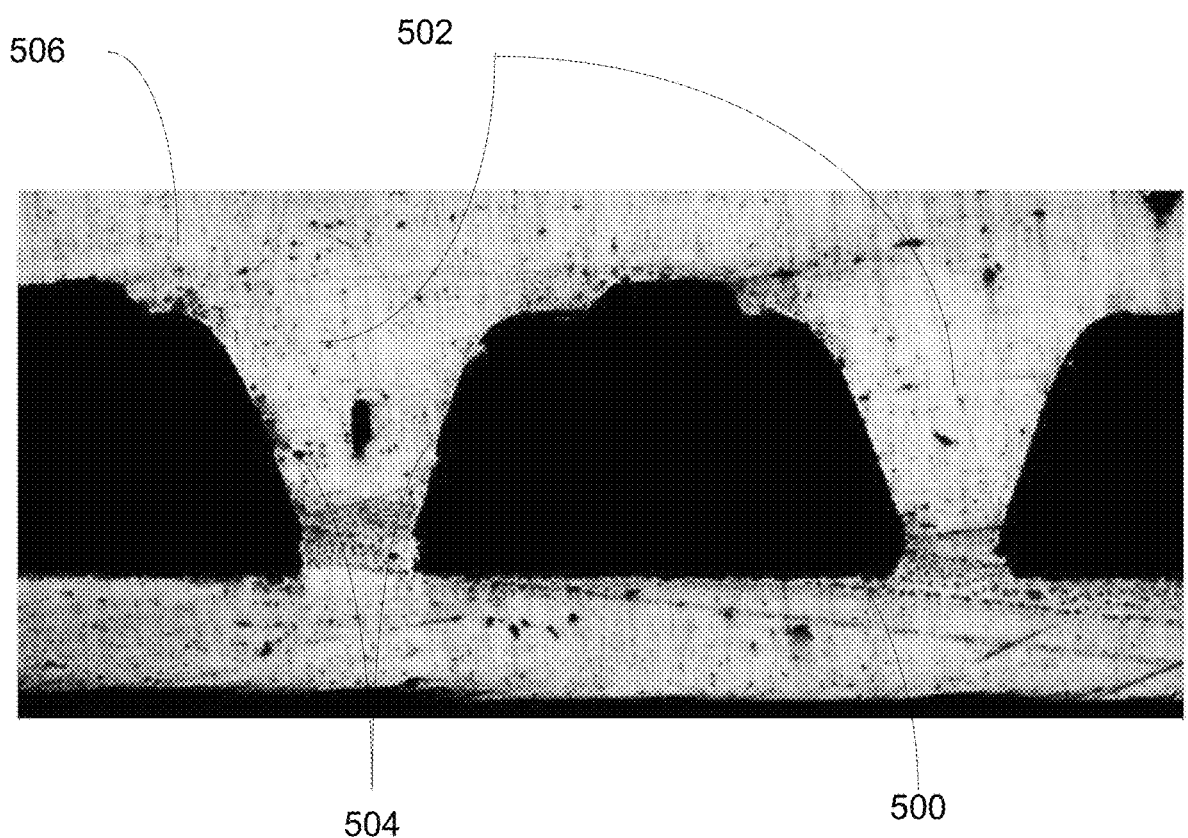
FIG. 17 is an illustration of a through package via filled with copper according to an exemplary embodiment of the present invention.
Figure 18A:
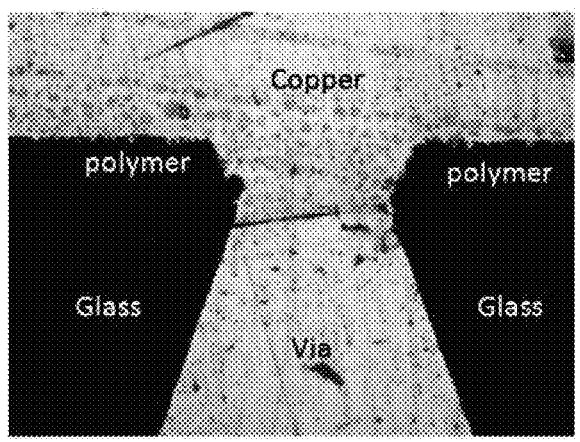
FIGS. 18a and 18b are cross-sectional optical images of metalized through package vias according to an exemplary embodiment of the present invention.
Figure 18B:
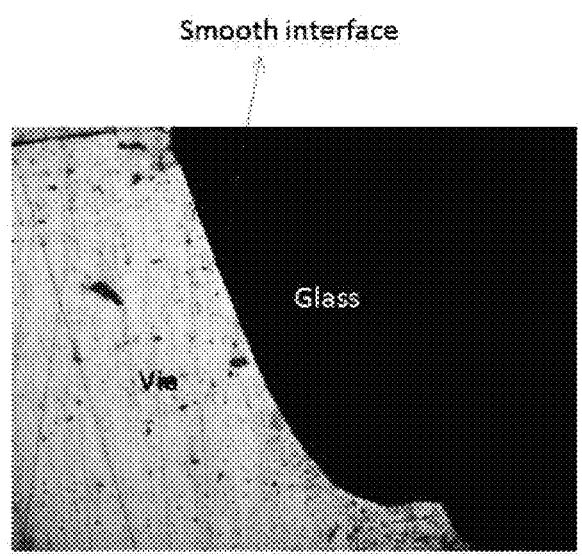
Figure 19A:
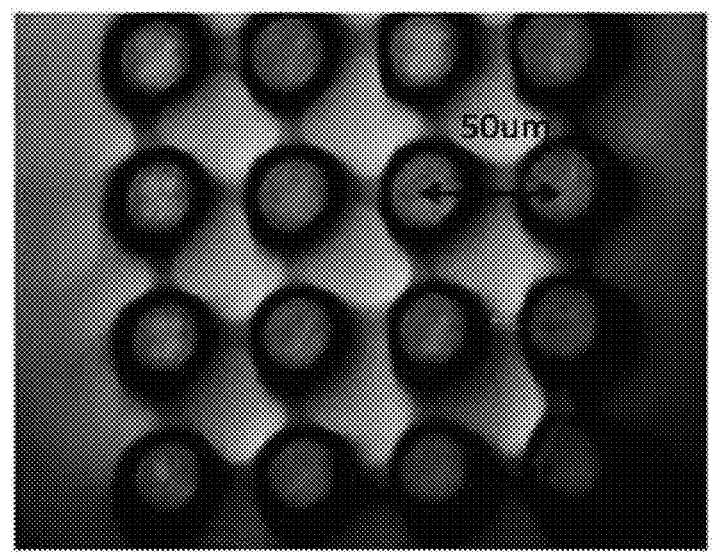
FIG. 19a is a top view of through package vias showing the metallization of the vias according to an exemplary embodiment of the present invention.
Figure 19B:
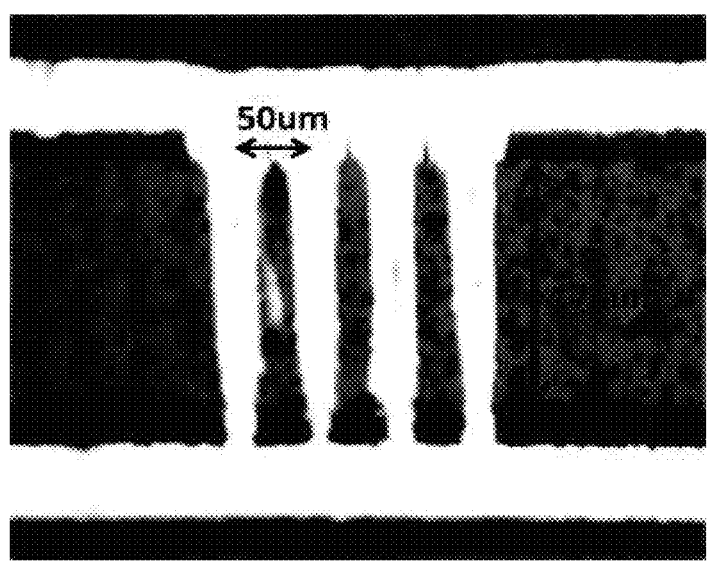
FIG. 19b is a side view of through package vias showing the metallization of the vias according to an exemplary embodiment of the present invention.

Sputtering of Ti—Cu on polymer laminated glass with TPV was carried out, with Ti thickness of 50 nm and copper thickness of 1 µm. The sputtered seed layer shows good adhesion to polymer surface. After sputtering; the TPVs were Cu-electroplated to achieve complete via fill. For the TPVs processed by $CO_2$ laser ablation, complete via fill was achieved as shown in FIGS. 17, 18a, and 18b. Shown in FIG. 17 are glass interposer 500 having a plurality of through package vias 502 with side walls 502. Copper metallization layer 506 is used to fill in vias 502 to produce through package vias. TPV metallization of smaller fine pitch vias (ablated by excimer lasers) was also carried out using sputtered seed layer and also electroless copper deposition. A top view and cross-section of TPV with metal fill of ultra fine pitch vias are shown in FIGS. 19*a* and 19*b*.

Figure 20:
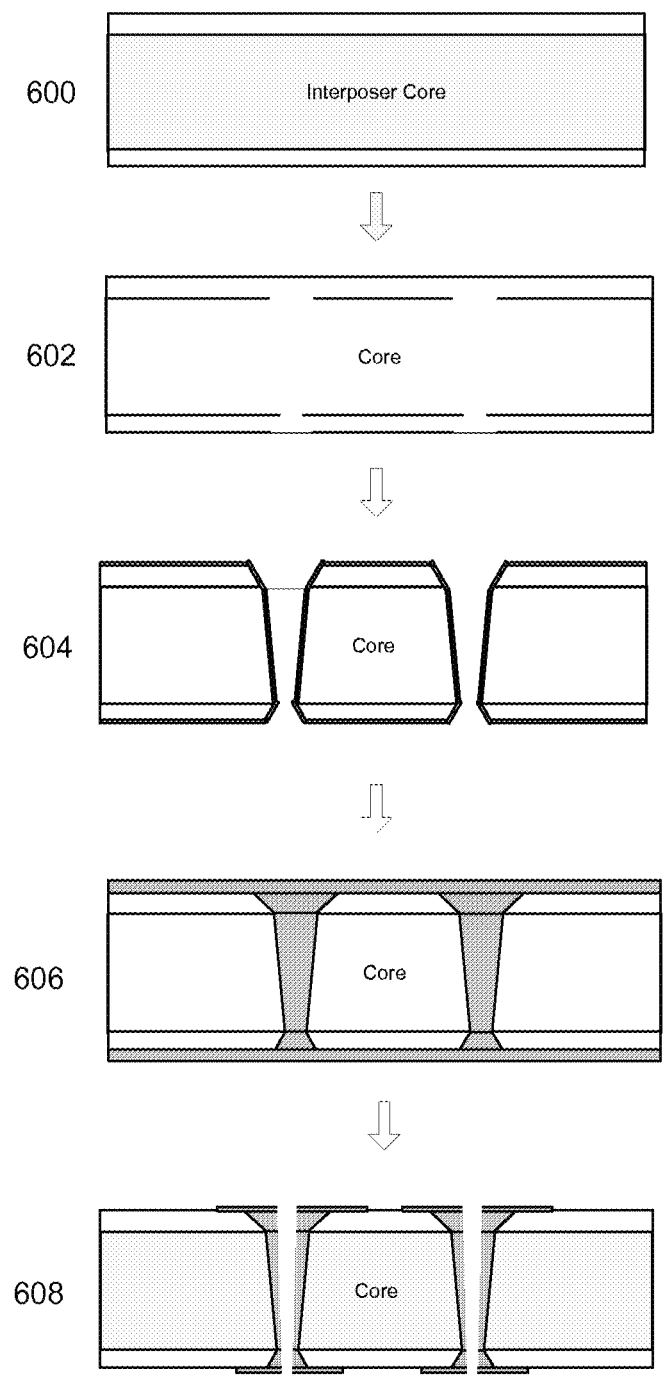
FIG. 20 is flow chart illustrating a method of producing a through package via according to an exemplary embodiment of the present invention.

FIG. 20 is an exemplary method for producing through vias in a glass interposer. A polymer is laminated 600 on at least a portion of a top surface of a glass interposer. In some embodiments of the present invention, a polymer is laminated on at least a portion of a bottom surface of the glass interposer. In another embodiment of the present invention, a copper or other metal layer is deposited on the glass surface or on the polymer lamination layer. At least a portion of the interposer and lamination are removed 602 to form a through via. A metallization seed layer is applied 604 before plating or depositing 606 a metal layer. Thereafter, a portion of the metallization layer is selectively removed 608 to form a metalized through package via.

Figure 21:
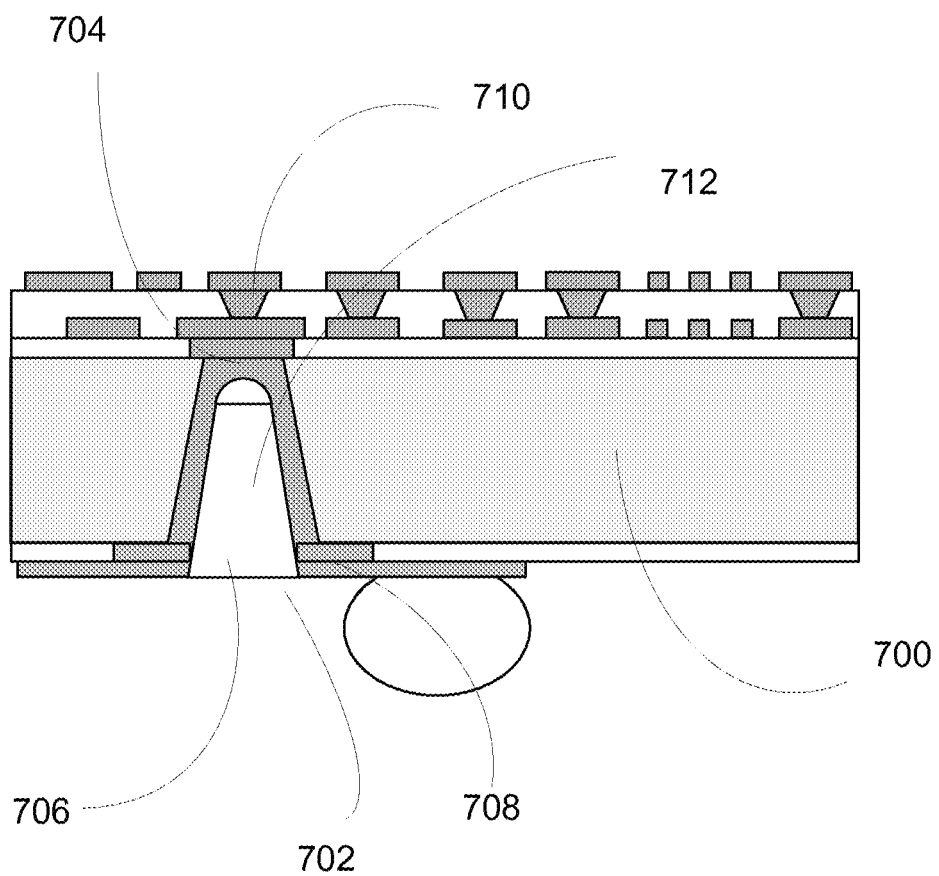
FIG. 21 illustrates a through package via having a closed end according to an exemplary embodiment of the present invention.

When removing the metallization seed layer and the lamination, as disclosed by way of example in FIG. 20, it can be beneficial to remove the material in such a way as to provide for other functionality or advantages. For example, FIG. 21 illustrates an interposer with a through via having one portion of the through via partially or fully closed off with the metallization layer. For example, and not by way of limitation, stress induced by thermal expansion and contraction can be absorbed by having one portion of a through via closed off while allowing the other portion to remain open. In FIG. 21, interposer 700, which can be manufactured from various types of media including BSG, has been ablated to remove material from interposer 700 to form through via 702. Through via 702 comprises a top portion 704 and a bottom portion 706. It should be noted that the designations of "top" and "bottom" are not intended to limit the present invention to any geometric or spatial configuration, but rather, are being used merely to designate two different portions for purposes of illustrating an exemplary embodiment of the present invention.

As shown in FIG. 21, the metallization layer 710 on top portion 704 when deposited was deposited in such a manner to close off top portion 704. But, when metallization layer 708 was deposited, the bottom portion 706 was not filled in, thus providing for one portion of through via 702, i.e. top portion 704, to be closed off while the bottom portion 706 remains open. When the interposer 700 and metallization layers 708 and 710 expand and contract due to thermal cycling, the open portion, in this illustration bottom portion 706, acts like a spring or resilient surface to absorb the expansion and contraction. In some embodiments of the present invention, the closed off portion on the top side facilitates blind via stacking. In some embodiments of the present invention, it may be advantageous or necessary to fill in the remaining portion of through via 702 with some media. In some embodiments, a filler 712 is deposited in through via 702. Filler 712 can be various types of materials including, without limitation, a polymer or a metal alloy. If through via 702 is not filled with a media, air can act as filler 712.

Figure 22:
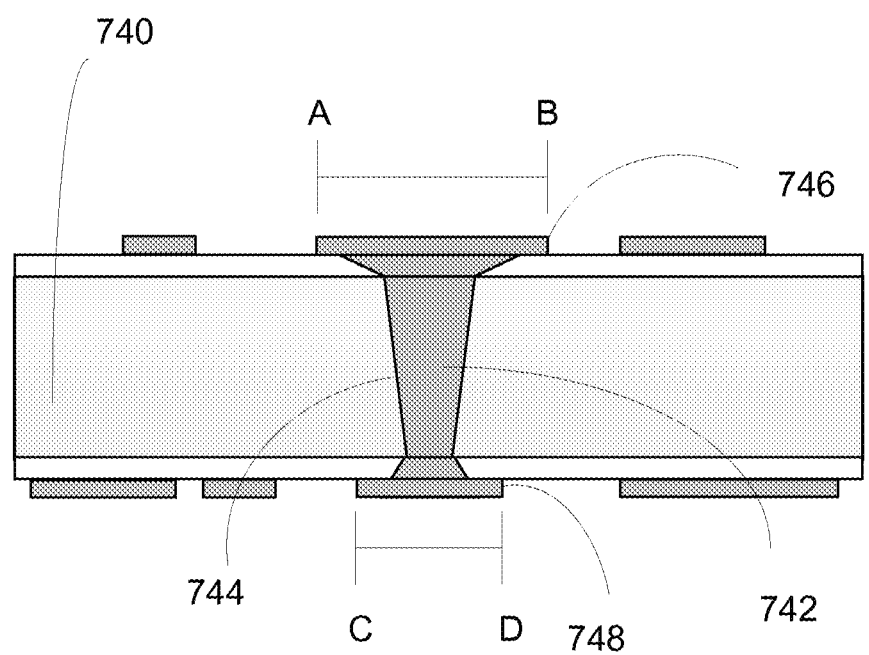
FIG. 22 illustrates a through package via having interlocks according to an exemplary embodiment of the present invention.

It can be necessary or desired to provide additional stabilization features in a through via. FIG. 22 illustrates the use of variable with metallization layers that help to secure the metallization in the through via in an interposer. Because in some instances the use of a seed layer deposited on the walls of a through via may be impractical, thus possibly reducing the adhesion between a metallization layer and the walls of the through via, when the materials of a through via are thermally cycled, the metallization in the through via may separate from the walls of the through via. Without other physical support to keep the metallization in the through via, the metallization may lift off of the walls of the through via and the interposer, possibly creating shorts or opens in the microelectronic package.

To help maintain the metallization in the through via through periods of thermal cycling, FIG. 22 illustrates the use of interlocks. Illustrated is interposer 740 with through via 742. Through via 742 has metallization 744 deposited throughout through via 744. In some embodiments, when metallization 744 was deposited, after deposition, portions of metallization 744 were selectively removed to form top interlock 746 and bottom interlock 748. It should be noted that the designations of "top" and "bottom" are not intended to limit the present invention to any geometric or spatial configuration, but rather, are being used merely to designate two different portions for purposes of illustrating an exemplary embodiment of the present invention.

Top interlock 746 has an outer diameter AB whereas bottom interlock 748 has an outer diameter CD. In some embodiments of the present invention, the length of diameter AB can be longer, shorter, or the same length as diameter CD. The relationship between the lengths of diameters AB and CD may vary depending on the particular application of through via 742, costs, or other factors. Interlocks 746 and 748 secure metallization 744 in through via 742. It is intended that even if through via 742 metallization 744 separates from the side walls of through via 742, the securing action provided by top interlock 746 in combination with bottom interlock 748 secures metallization 744 in through via 742.

Figure 23:
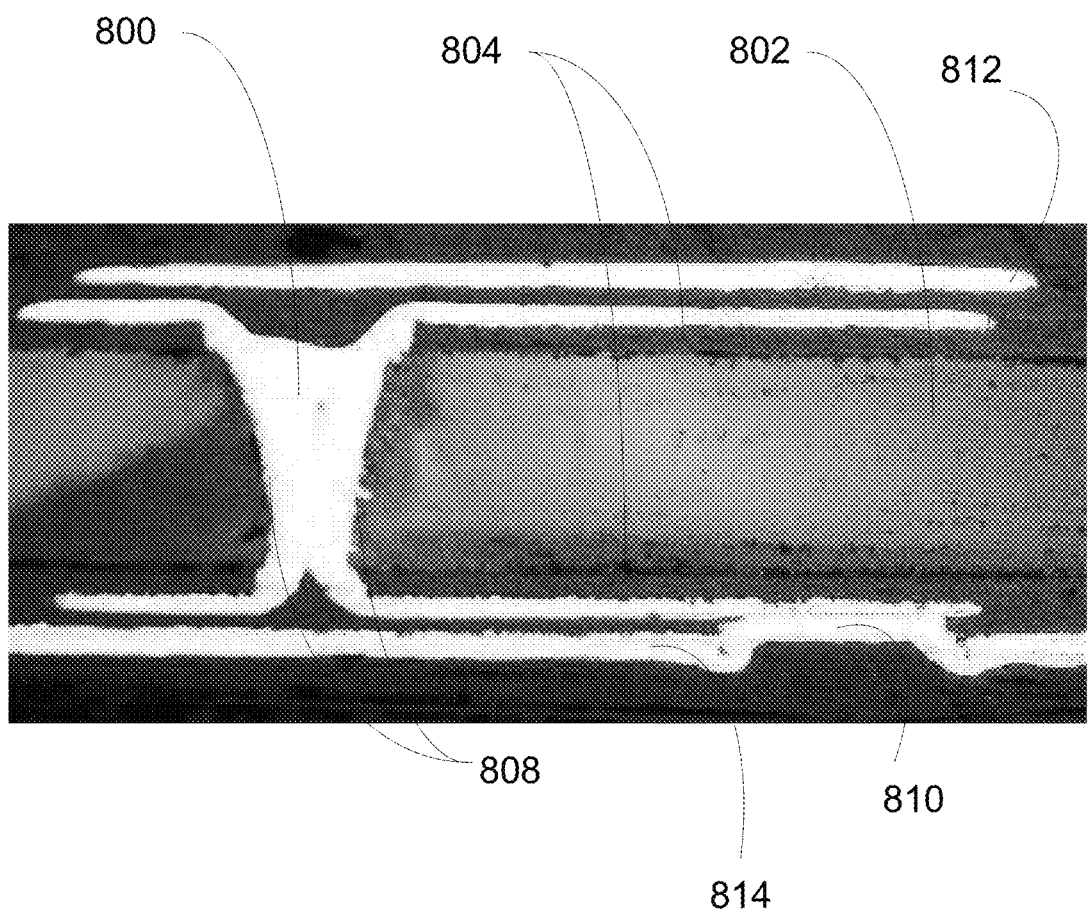
FIG. 23 is a side view of a four metal layer structure having a through package via according to an exemplary embodiment of the present invention.

Using various securement features, such as interlocks 746 and 748 of FIG. 22 or the closed off portion 704 of FIG. 21 can provide for additional features to be built onto a through package via. For example, because the reliability of the through package vias can be increased, additional polymer layer features can be built on the through package vias. FIG. 23 is a cross-section of a four-metal layer structure a glass interposer with polymer buildup. The cross-sectional view of FIG. 23 shows a four-metal layer structure with larger via diameters (with entrance diameter of 150 µm). Via 800 on glass interposer 802 was fabricated after depositing polymer lamination 804 on glass interposer 802. Double side simultaneous process was used to obtain patterned metallization. In this embodiment, lamination 804 was not deposited on the walls 806 of via 800. Blind staggered vias, such as via 810, can be used to connect topmost metal layer 812 with the adjacent bottom metal layer 814. Metallization on the polymer buildup can be carried out using various processes including, but not limited to, a semi-additive plating process. The use of blind vias, such as via 810, can, among other benefits, help to ease the interconnection conflicts present in high density interconnect packaging.

Figure 24:
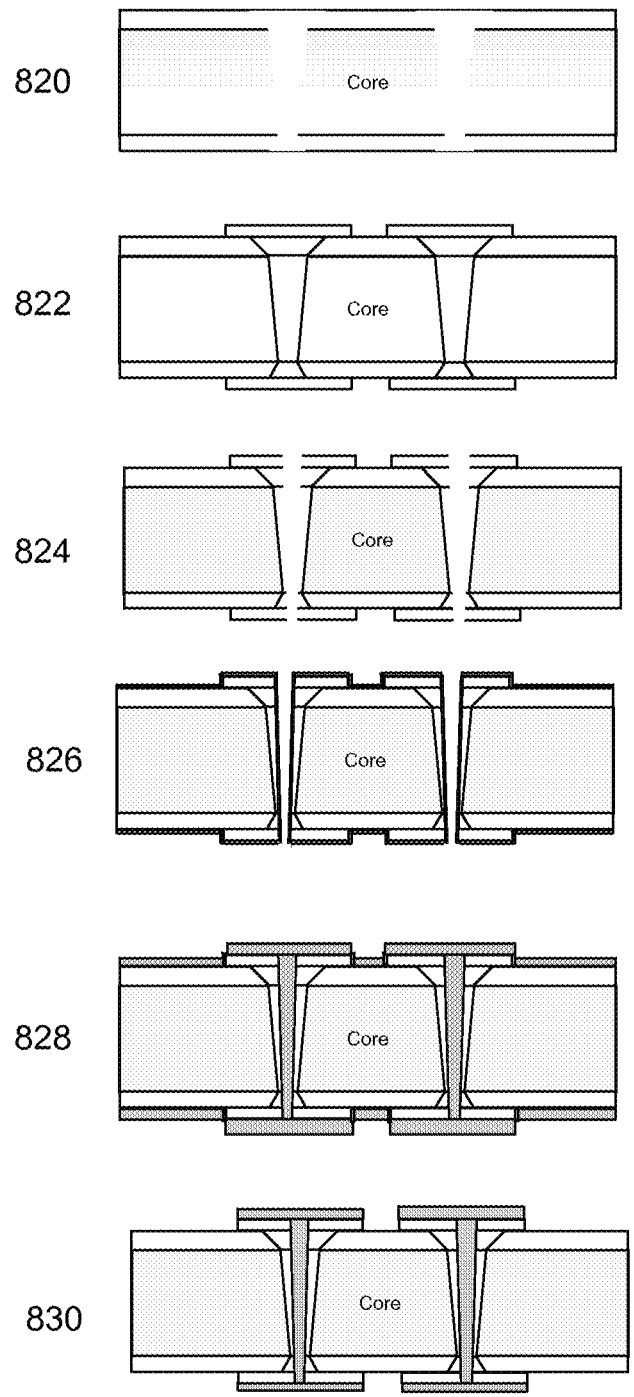
FIG. 24 is a flowchart illustrating an alternate method of producing a through package via according to an exemplary embodiment of the present invention.

FIG. 24 is an alternate exemplary method to produce through package vias. A portion of a glass interposer is removed 820 to form a through via. The through via is then filled 822 with a stress relief barrier material such as a dielectric or polymeric material. At least a portion of the dielectric is removed 824 to form at least one high density through via. A metallization seed layer is applied 826 on at least a portion of the lamination layer, wherein the metallization seed layer also fills at least a portion of at least one through hole. A metal forming the metallization layer is deposited 828 on the seed layer. Thereafter, a portion of the metallization layer is selectively removed 830 to form a metalized through package via. In this exemplary embodiment, the metallization layer is removed to form interlocks.

While the present disclosure has been described in connection with a plurality of exemplary embodiments, as illustrated in the various figures and discussed above, it is understood that other similar embodiments can be used or modifications and additions can be made to the described embodiments for performing similar functions of the present invention without deviating therefrom. Therefore, the present invention should not be limited to any single embodiment, but rather construed in breadth and scope in accordance with the following claims.

What is claimed is:

1. A method comprising:
   applying a polymer layer on at least a portion of a top surface and a bottom surface of a glass interposer;
   removing at least a portion of the polymer layers and at least a portion of the glass of the glass interposer to form a through via with side walls;
   filling at least a portion of the through via with a metal conductor to form a metallization layer;
   selectively removing at least a portion of the metallization layer to form a metalized through package via; and
   depositing the metallization layer on at least a portion of a side wall of the side walls of the through via;
   wherein the polymer layers form continuous layers along the top and bottom surfaces of the glass interposer from about a top portion and a bottom portion of the through via.

2. The method of claim 1 further comprising depositing a metallization seed layer on at least a portion of the top surface polymer layer prior to filling at least a portion of the through via with the metal conductor.

3. The method of claim 1, wherein applying the polymer layers on at least a portion of both the top surface and the bottom surface is performed simultaneously.

4. The method of claim 1, wherein filling at least a portion of the through via with the metal conductor further comprises closing off one or both of a top portion or a bottom portion of the through via.

5. The method of claim 1, wherein the polymer layers comprise resin-coated copper.

6. The method of claim 1 further comprising depositing a dielectric layer within the through via.

7. The method of claim 6, wherein depositing the dielectric layer comprises a depositing process selected from the group consisting of spin coating the dielectric layer, spraying the dielectric layer, dipping the interposer in the dielectric layer, laminating dry films of the dielectric layer, vacuum coating the dielectric layer, and combinations thereof.

8. The method of claim 1, wherein removing at least a portion of the polymer layers and at least a portion of the glass of the glass interposer comprises using laser or mechanical drilling.

9. The method of claim 1, wherein removing at least a portion of the polymer layers and at least a portion of the glass of the glass interposer comprises using a laser selected from the group consisting of a $CO_2$, UV, and excimer.

10. The method of claim 1, wherein selectively removing at least a portion of the metallization layer forms at least one interlock.

11. A method comprising:
    applying a dielectric on at least a portion of a top surface and a bottom surface of a glass interposer to form a laminated interposer;
    removing at least a portion of the glass of the glass interposer and at least a portion of the dielectric on the top and bottom surfaces of the glass interposer to form a void;
    filling the void with the dielectric;
    removing at least a portion of the dielectric to form at least one high-density through via with side walls;
    applying a metallization seed layer on at least a portion of the dielectric and at least a portion of a side wall of the side walls of the at least one high-density through via; and
    selectively removing at least a portion of the metallization seed layer to form a metalized through package via;
    wherein the dielectric forms a continuous layer along the top and bottom surfaces of the glass interposer from about a top portion and a bottom portion of the void.

12. The method of claim 4 further comprising filling at least a portion of the through via with a filler substance selected from the group consisting of air, polymer, a metal alloy, and a combination thereof.

13. The method of claim 11, wherein selectively removing at least a portion of the metallization layer forms at least one interlock.

14. The method of claim 1, wherein the through via has at least a portion of the polymer layer, the metallization seed layer, or a combination thereof formed on at least a portion of a side wall of the side walls of the through via.

15. The method of claim 1 further comprising applying a surface preparation process before applying the polymer layers.

16. The method of claim 11, further comprising applying a surface preparation process before applying the dielectric.

17. The method of claim 15, wherein applying the surface preparation process comprises:
    plasma treating at least a portion of the top and bottom surfaces of the glass interposer; and
    applying an adhesion promoter to at least a portion of the plasma treated surfaces.

18. The method of claim 16, wherein applying the surface preparation process comprises:
    plasma treating at least a portion of the top and bottom surfaces of the glass interposer; and
    applying an adhesion promoter to at least a portion of the plasma treated surfaces.

* * * * *